US011100958B2

(12) United States Patent
Kim et al.

(10) Patent No.: US 11,100,958 B2
(45) Date of Patent: Aug. 24, 2021

(54) SEMICONDUCTOR MEMORY DEVICE

(71) Applicant: SAMSUNG ELECTRONICS CO., LTD., Suwon-si (KR)

(72) Inventors: Hui-Jung Kim, Seongnam-si (KR); Keunnam Kim, Yongin-si (KR); Hunkook Lee, Hwaseong-si (KR); Yoosang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/522,958

(22) Filed: Jul. 26, 2019

(65) Prior Publication Data

US 2020/0111512 A1    Apr. 9, 2020

(30) Foreign Application Priority Data

Oct. 4, 2018  (KR) .................. 10-2018-0118217

(51) Int. Cl.
| | | |
|---|---|---|
| *H01L 27/105* | (2006.01) | |
| *G11C 5/06* | (2006.01) | |
| *G11C 8/14* | (2006.01) | |
| *G11C 7/18* | (2006.01) | |

(52) U.S. Cl.
CPC .............. *G11C 5/063* (2013.01); *G11C 7/18* (2013.01); *G11C 8/14* (2013.01); *H01L 27/105* (2013.01)

(58) Field of Classification Search
CPC .......... G11C 5/063; G11C 7/18; H01L 27/105
See application file for complete search history.

(56) References Cited

U.S. PATENT DOCUMENTS

| | | |
|---|---|---|
| 8,004,015 B2 | 8/2011 | Yoon |
| 8,040,745 B2 | 10/2011 | Shibata |
| 9,514,792 B2 | 12/2016 | Kajigaya |
| 9,806,082 B2 | 10/2017 | Tanaka et al. |
| 9,806,088 B2 | 10/2017 | Inatsuka |
| 2009/0273088 A1 | 11/2009 | Chung et al. |
| 2016/0268290 A1* | 9/2016 | Matsunaga ....... H01L 27/11575 |
| 2017/0053906 A1 | 2/2017 | Or-Bach et al. |
| 2017/0092371 A1 | 3/2017 | Harari |
| 2018/0061481 A1 | 3/2018 | Kawamura et al. |
| 2018/0082750 A1 | 3/2018 | Ikeda et al. |

* cited by examiner

*Primary Examiner* — Fernando L Toledo
*Assistant Examiner* — Valerie N Newton
(74) *Attorney, Agent, or Firm* — F. Chau & Associates, LLC

(57) ABSTRACT

A semiconductor memory device comprising a substrate including a cell region, first and second contact regions, and a bit peripheral circuit region disposed between the first and second contact regions. A first stack structure is disposed on the cell region and the first contact region. A second stack structure is disposed on the cell region and the second contact region. A peripheral transistor is disposed on the bit peripheral circuit region and is electrically connected to the first and second stack structures. Each of the first and second stack structures comprises semiconductor patterns vertically stacked on the cell region, and conductive lines having connection with the semiconductor patterns and extending along a first direction from the cell region onto corresponding first and second contact regions. The conductive lines have stepwise structures on the first and second contact regions.

16 Claims, 25 Drawing Sheets

SEMICONDUCTOR MEMORY DEVICE

CROSS-REFERENCE TO RELATED APPLICATION

This application claims priority under 35 U.S.C. § 119 to Korean Patent Application No. 10-2018-0118217, filed Oct. 4, 2018 in the Korean Intellectual Property Office (KIPO), the disclosure of which is incorporated by reference its entirety herein.

TECHNICAL FIELD

The present inventive concepts relate to a semiconductor device, and more particularly, to a three-dimensional semiconductor memory device with increased integration.

DISCUSSION OF RELATED ART

With the ever increasing demand for higher integrated semiconductor devices, manufacturers continue to search for technology advances to further increase performance and density. The level of integration of two-dimensional or planar semiconductor devices is primarily determined by the area occupied by a unit memory cell. Therefore, the level of integration is greatly influenced by the ability to form fine patterns. However, the processing equipment needed to increase pattern fineness is very expensive and may set a practical limitation on increasing the integration of the two-dimensional or planar semiconductor devices.

SUMMARY

Some exemplary embodiments of the present inventive concepts provide a three-dimensional semiconductor memory device with increased integration.

According to some exemplary embodiments of the present inventive concepts, a semiconductor memory device may include a substrate including a cell region, first and second contact regions, and a bit peripheral circuit region disposed between the first and second contact regions. A first stack structure is disposed on the cell region and the first contact region. A second stack structure is disposed on the cell region and the second contact region. A peripheral transistor is disposed on the bit peripheral circuit region, the peripheral transistor being electrically connected to the first and second stack structures. Each of the first and second stack structures comprises a plurality of semiconductor patterns vertically stacked on the cell region and a plurality of conductive lines that are connected to the semiconductor patterns and extend along a first direction from the cell region onto corresponding first and second contact regions. The conductive lines have stepwise structures on the first and second contact regions.

According to some exemplary embodiments of the present inventive concepts, a semiconductor memory device may include a substrate, a first stack structure and a second stack structure disposed on the substrate. A connection line that extends in a first direction on the first and second stack structures. Each of the first and second stack structures includes a plurality of semiconductor patterns vertically stacked on the substrate and a gate electrode vertically extending adjacent to the semiconductor patterns. The connection line is electrically connected to one of the gate electrodes of the first and second stack structures and electrically separated from one of the gate electrodes of the first and second stack structures.

According to some exemplary embodiments, a semiconductor memory device may include a substrate, a first stack structure and a second stack structure disposed on the substrate. A ground line extends in a first direction between the first and second stack structures. A connection line is included on the first and second stack structures. Each of the first and second stack structures includes a plurality of semiconductor patterns that are vertically stacked, a plurality of capacitors connected to corresponding semiconductor patterns and a gate electrode that vertically extends adjacent to the semiconductor patterns. The connection line is electrically connected to at least one of the gate electrodes of the first and second stack structures. The connection line includes a first segment that extends in a second direction on the first stack structure, the second direction intersecting the first direction. The connection line also includes a second segment that extends in the second direction on the second stack structure. The connection line also includes a third segment that connects the first segment and the second segment to each other on the ground line. The first and second segments are offset from each other in the first direction.

DETAILED DESCRIPTION OF THE EXEMPLARY EMBODIMENTS

Figure 1:
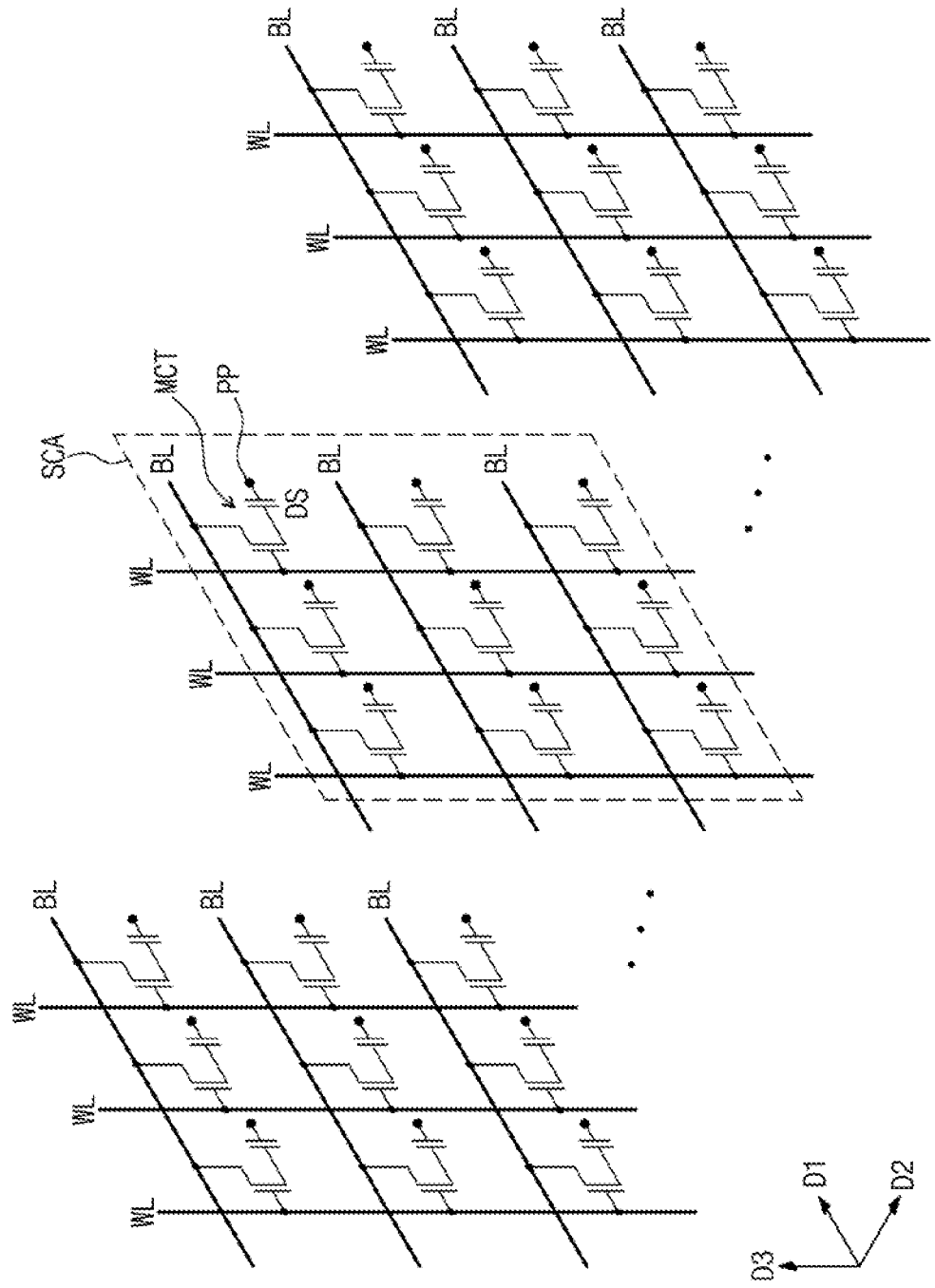
FIG. 1 illustrates a simplified circuit diagram showing a cell array of a three-dimensional semiconductor memory device according to some exemplary embodiments of the present inventive concepts.
Figure 2:
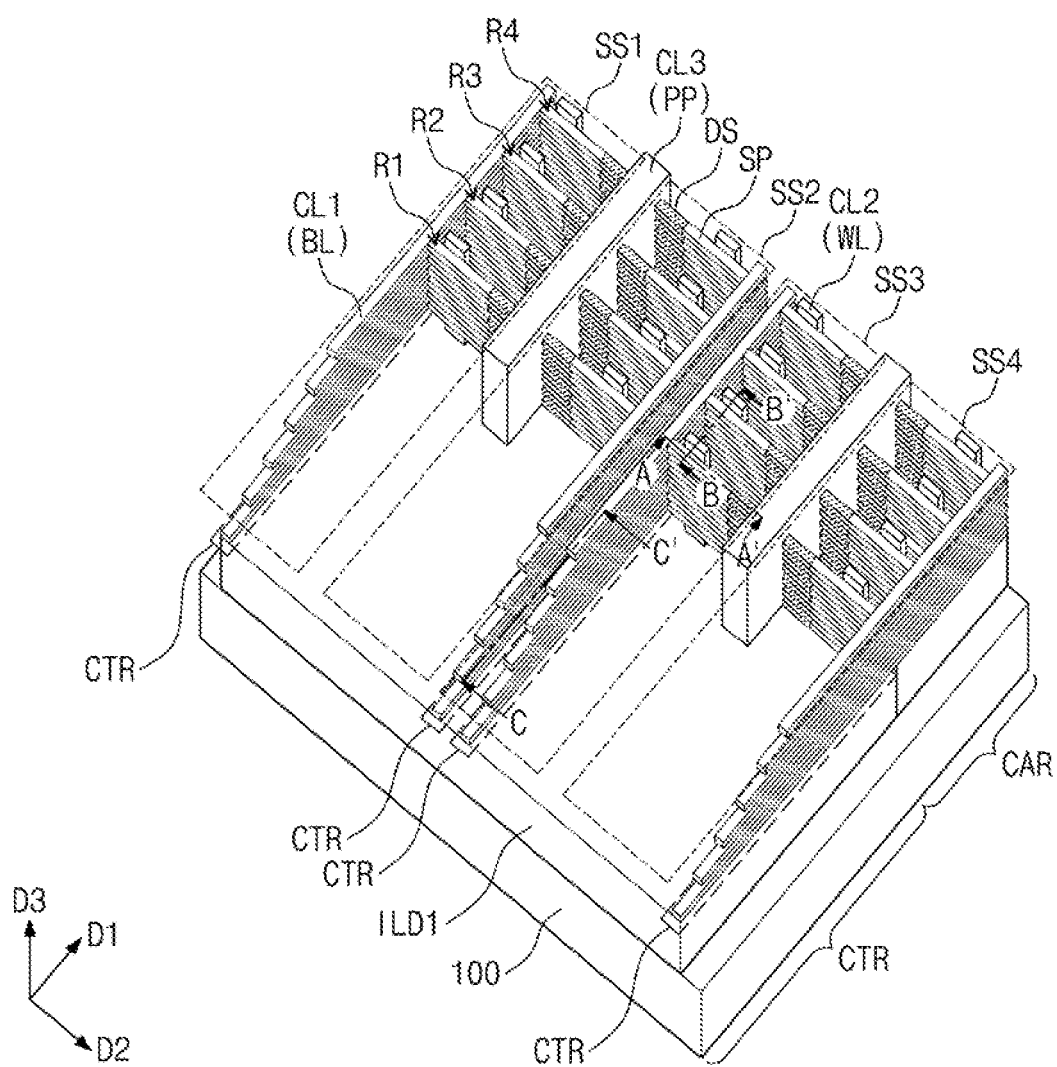
FIG. 2 illustrates a perspective view showing a three-dimensional semiconductor memory device according to some exemplary embodiments of the present inventive concepts.

Referring to FIG. 1, a three-dimensional semiconductor memory device according to some exemplary embodiments of the present inventive concepts may include a cell array which includes a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. A memory cell transistor MCT may be disposed between a word line WL and a hit line BL.

The hit lines BL may be conductive patterns (e.g., metal lines) that are disposed on a substrate and are spaced apart from each other. In one exemplary embodiment, the bit lines BL may extend in a first direction D1. In one exemplary embodiment, the plurality of bit lines BL in one sub-cell array SCA are spaced apart from each other in a vertical direction (e.g., a third direction D3).

The word lines WL may be conductive patterns (e.g., metal lines) that extend in the vertical direction (e.g., the third direction D3) from the substrate. In one exemplary embodiment, the plurality of the word lines WL in a sub-cell array SCA are spaced apart from each other in the first direction D1.

In one exemplary embodiment, a gate of the memory cell transistor MCT may be connected to the word line WL, and a source of the memory cell transistor MCT may be connected to the bit line BL. Each of the memory cell transistors MCT may include a data storage element DS. For example, the data storage element DS may be a capacitor and a drain of the memory cell transistor MCT may be connected to a first electrode of the capacitor. A second electrode of the capacitor may be connected to a ground line PP.

Referring to FIGS. 1, 2, 3A, 3B, 3C, and 4, a substrate 100 may be provided which includes a cell region CAR and contact regions CTR. The contact regions CTR may be disposed on one side of the cell array region CAR. In an exemplary embodiment, each of the contact regions CTR may have a bar or linear shape extending in a first direction D1. A first interlayer dielectric layer ILD1 may be provided on the substrate 100. In exemplary embodiments, the substrate 100 may be a silicon substrate, a germanium substrate, or a silicon-germanium substrate.

The substrate 100 may be provided thereon with a plurality of stack structures. For example, the embodiment shown in FIG. 2 includes first, second, third and fourth stack structures SS1, SS2, SS3, and SS4. The first to fourth stack structures SS1 to SS4 may be vertically spaced apart from the substrate 100 across the first interlayer dielectric layer IDL1. The first to fourth stack structures SS1 to SS4 may extend parallel to each other in the first direction D1. The first to fourth stack structures SS1 to SS4 may be arranged along a second direction D2. Each of the first to fourth stack structures SS1 to SS4 may include the sub-cell array SCA discussed above with reference to FIG. 1.

Each of the first to fourth stack structures SS1 to SS4 may include semiconductor patterns SP and dielectric layers IL that are alternately stacked on the first interlayer dielectric layer ILD1. The dielectric layers IL may be configured to vertically separate the stacked semiconductor patterns SP from each other. For example, the dielectric layer IL may be interposed between a pair of vertically stacked semiconductor patterns SP. In an exemplary embodiment, the dielectric layers IL may include one of a silicon oxide layer, a silicon nitride layer, a silicon oxynitride layer, a carbon-containing silicon oxide layer, a carbon-containing silicon nitride layer, and a carbon-containing silicon oxynitride layer.

Figure 3A:
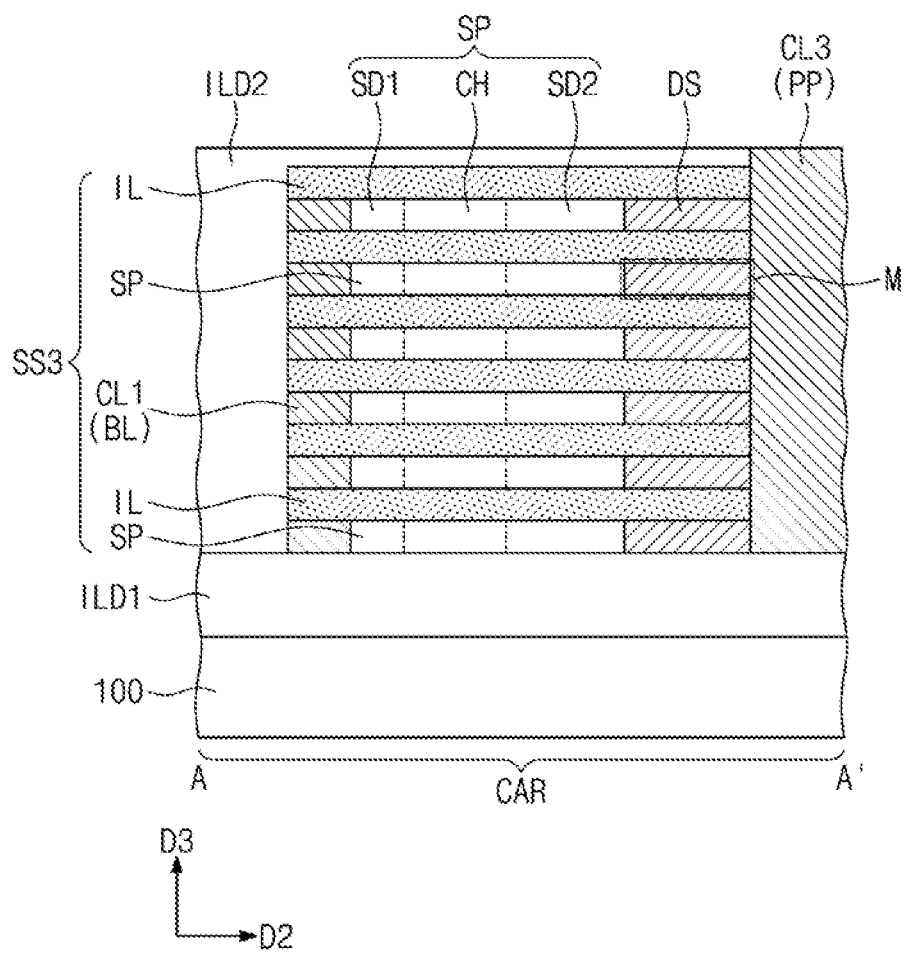
FIGS. 3A, 3B, and 3C illustrate cross-sectional views respectively taken along lines A-A', B-B', and C-C' of FIG. 2 according to some exemplary embodiments of the present inventive concepts.

In exemplary embodiments, each of the semiconductor patterns SP may have a linear, bar, or pillar shape extending in the second direction D2. The semiconductor patterns SP may include silicon, germanium, silicon-germanium, or indium gallium zinc oxide (IGZO). As shown in FIG. 3A, each of the semiconductor patterns SP may include a first impurity region SD1, a second impurity region SD2, and a channel region CH.

The channel region CH may be disposed between the first and second impurity regions SD1 and SD2. The first and second impurity regions SD1 and SD2 may have a first conductive type (e.g., n-type). In exemplary embodiments, the channel region CH may be undoped or may have a second conductive type (e.g., p-type) different from the first conductive type.

The channel region CH may correspond to a channel of the memory cell transistor MCT discussed with reference to FIG. 1. The first and second impurity regions SD1 and SD2 may respectively correspond to the source and drain of the memory cell transistor MCT discussed with reference to FIG. 1.

The semiconductor patterns SP may be provided on the cell region CAR of the substrate 100. In an exemplary embodiment, each of the first to fourth stack structures SS1 to SS4 may include the semiconductor patterns SP on first, second, third, and fourth rows R1, R2, R3, and R4. Each of the first to fourth rows R1 to R4 may include the semiconductor patterns SP that are vertically stacked and overlapped with each other. For example, the number of the semiconductor patterns SP on each of the first to fourth rows R1 to R4 may be six, but the present inventive concepts are not limited thereto. The first to fourth rows R1 to R4 may be arranged spaced apart from each other along the first direction D1.

Each of the first to fourth stack structures SS1 to SS4 may further include vertically stacked first conductive lines CL1. The dielectric layers IL may vertically separate the vertically stacked first conductive lines CL1 from each other. The dielectric layer IL may be interposed between a pair of vertically neighboring first conductive lines CL1.

Each of the first conductive lines CL1 may have a linear or bar shape extending in the first direction D1. The first conductive lines CL1 may extend from the cell region CAR onto the contact region CTR of the substrate 100.

The first conductive lines CL1 may directly contact corresponding semiconductor patterns SP. For example, each of the first conductive lines may be located at substantially the same level as the semiconductor patterns SP that it contacts. The first conductive lines CL1 may be connected to the first impurity regions SD1 of the semiconductor patterns SP. As shown in FIG. 3A, the semiconductor patterns SP on each of the first to fourth rows R1 to R4 may extend in the second direction D2 from the first conductive lines CL1 located at the same level as that of the semiconductor patterns SP.

Figure 3B:
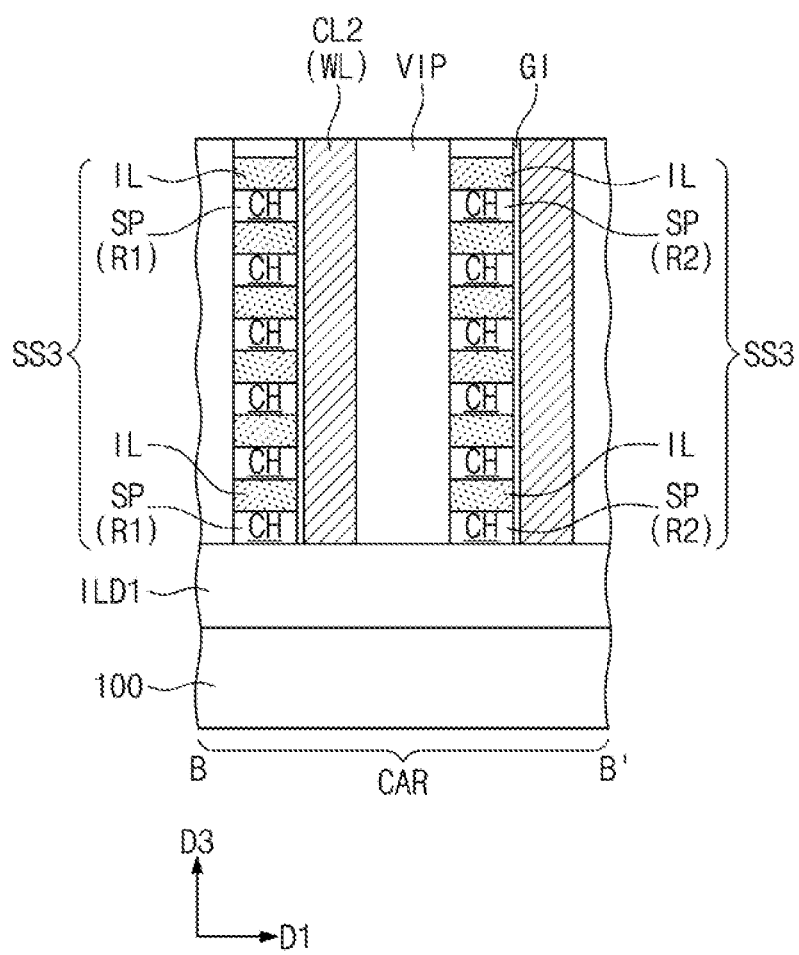
Figure 3C:
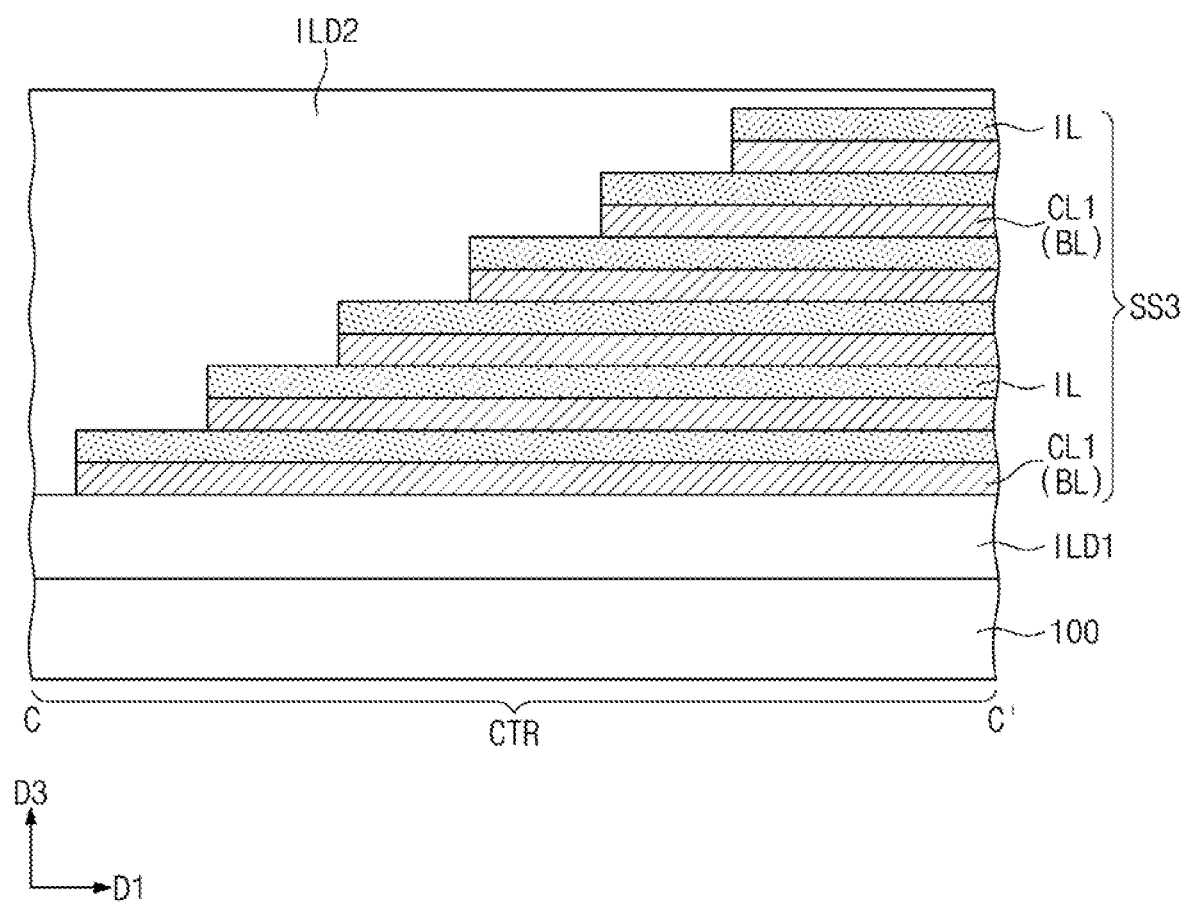

Referring to FIG. 3C, each of the first to fourth stack structures SS1 to SS4 may have a stepwise structure on the contact regions CTR of the substrate 100. The first conductive lines CL1 stacked on the contact regions CTR may have lengths which extend in the first direction D1. In an exemplary embodiment, the lengths of the first conductive lines may decrease as the distance from the first conductive line to a top surface of the substrate 100 increases. For example, the length of a lowermost first conductive line CL1 may be greater than the length of any other first conductive line CL1 located at a higher level than a level of the lowermost first conductive line CL1. The length of the uppermost first conductive line CL1 may be less than the length of any other first conductive line CL1.

The first conductive lines CL1 may include a conductive material. For example, the conductive material may include one or more of a doped semiconductor material (e.g., doped silicon, doped germanium, etc.), a conductive metal nitride material (e.g., titanium nitride, tantalum nitride, etc.), a metallic material (tungsten, titanium, tantalum, etc.), and a metal-semiconductor compound (e.g., tungsten silicide, cobalt silicide, titanium silicide, etc.). The first conductive lines CL1 may correspond to the bit lines BL discussed with reference to FIG. 1.

Figure 7:
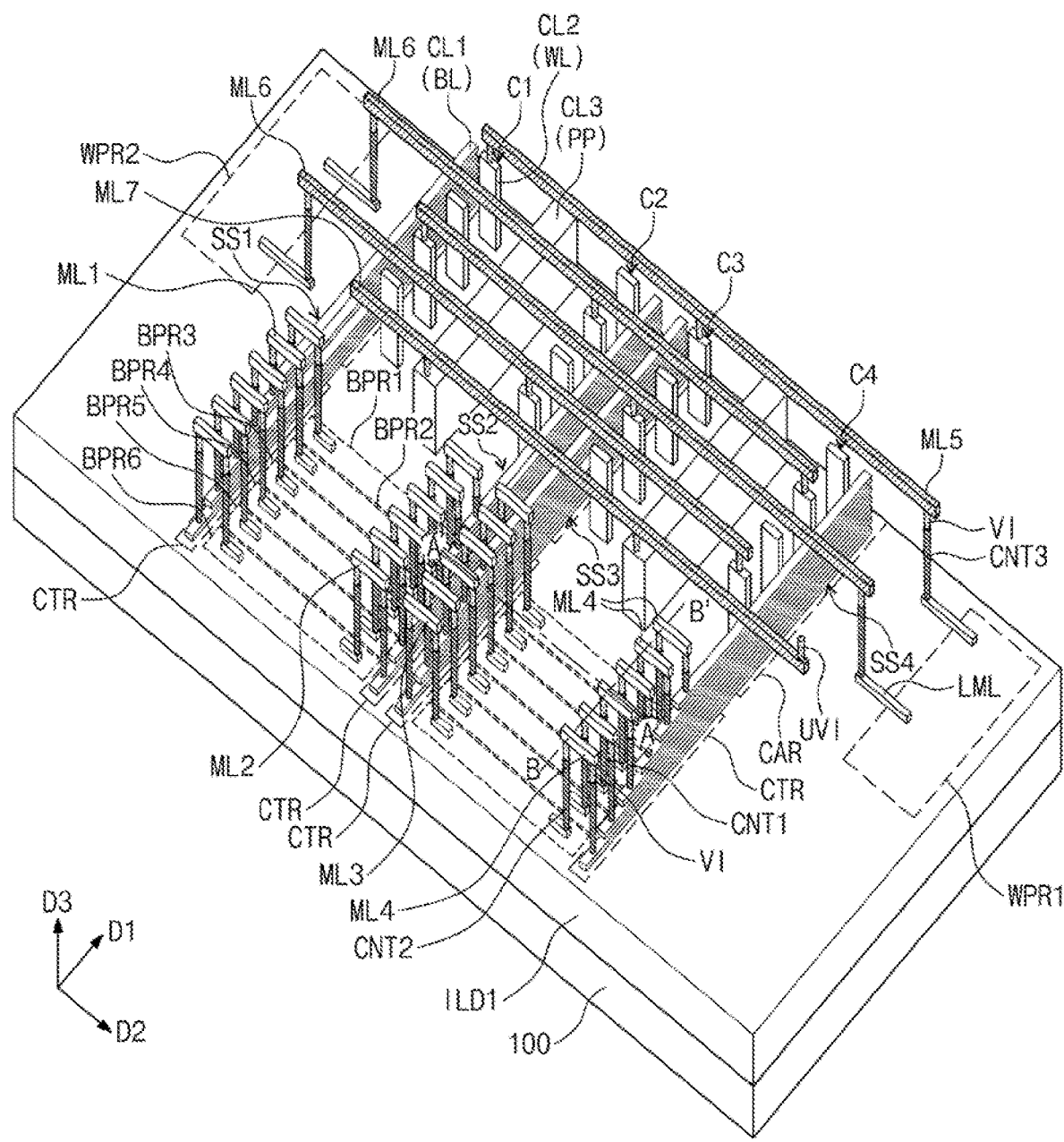
FIG. 7 illustrates a perspective view showing a three-dimensional semiconductor memory device according to some exemplary embodiments of the present inventive concepts.
Figure 8A:
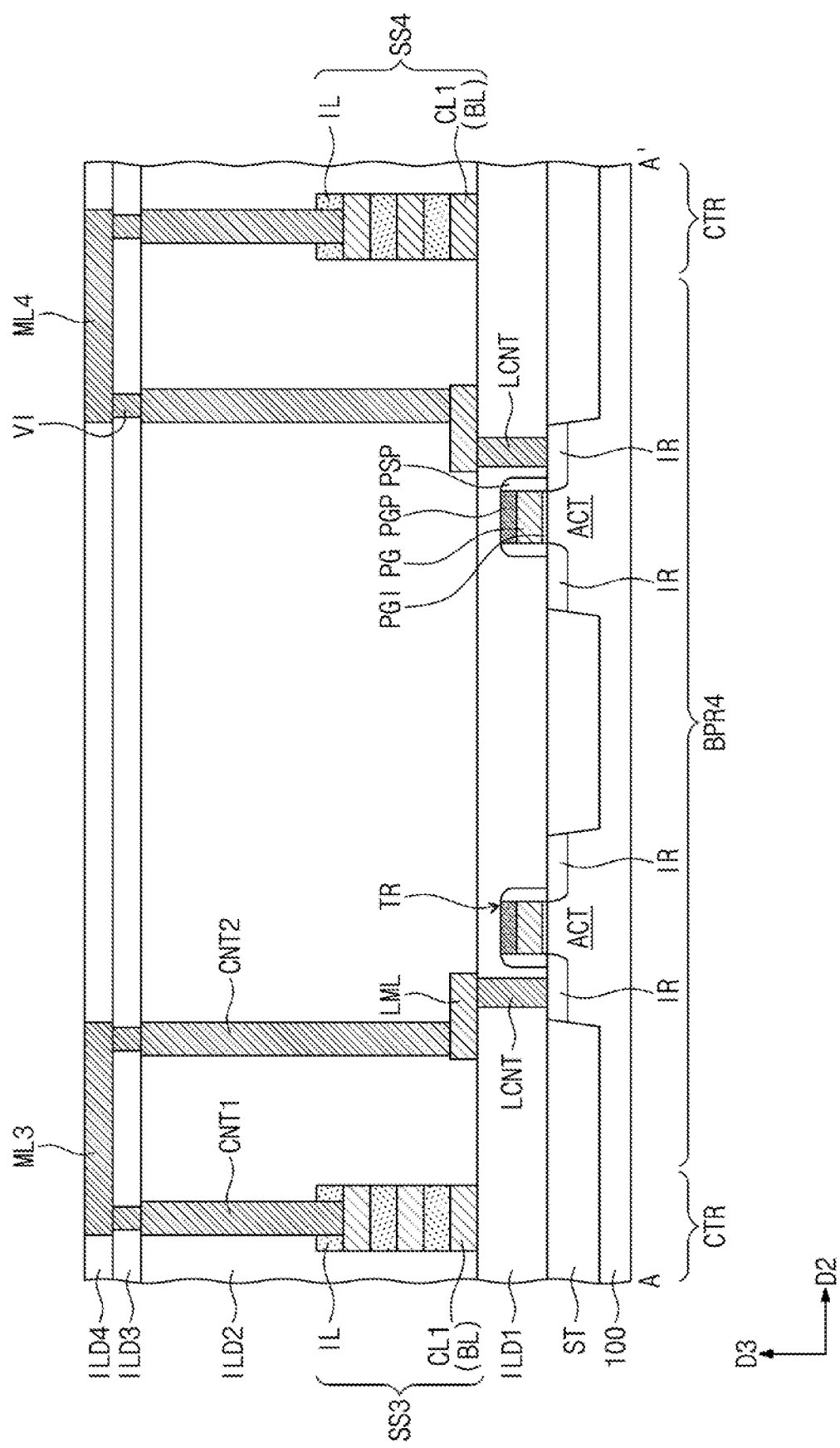
FIGS. 8A and 8B illustrate cross-sectional views respectively taken along lines A-A' and B-B' of FIG. 7 according to some exemplary embodiments of the present inventive concepts.
Figure 8B:
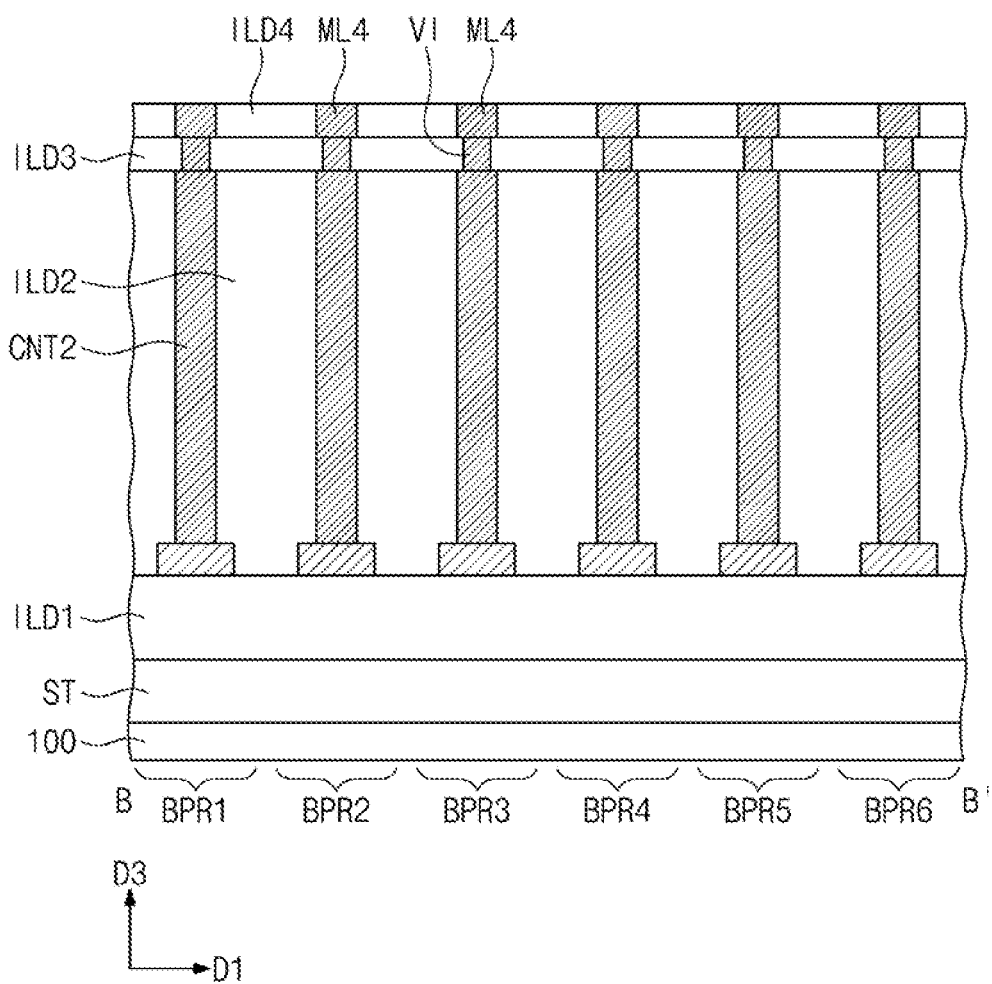
Figure 8C:
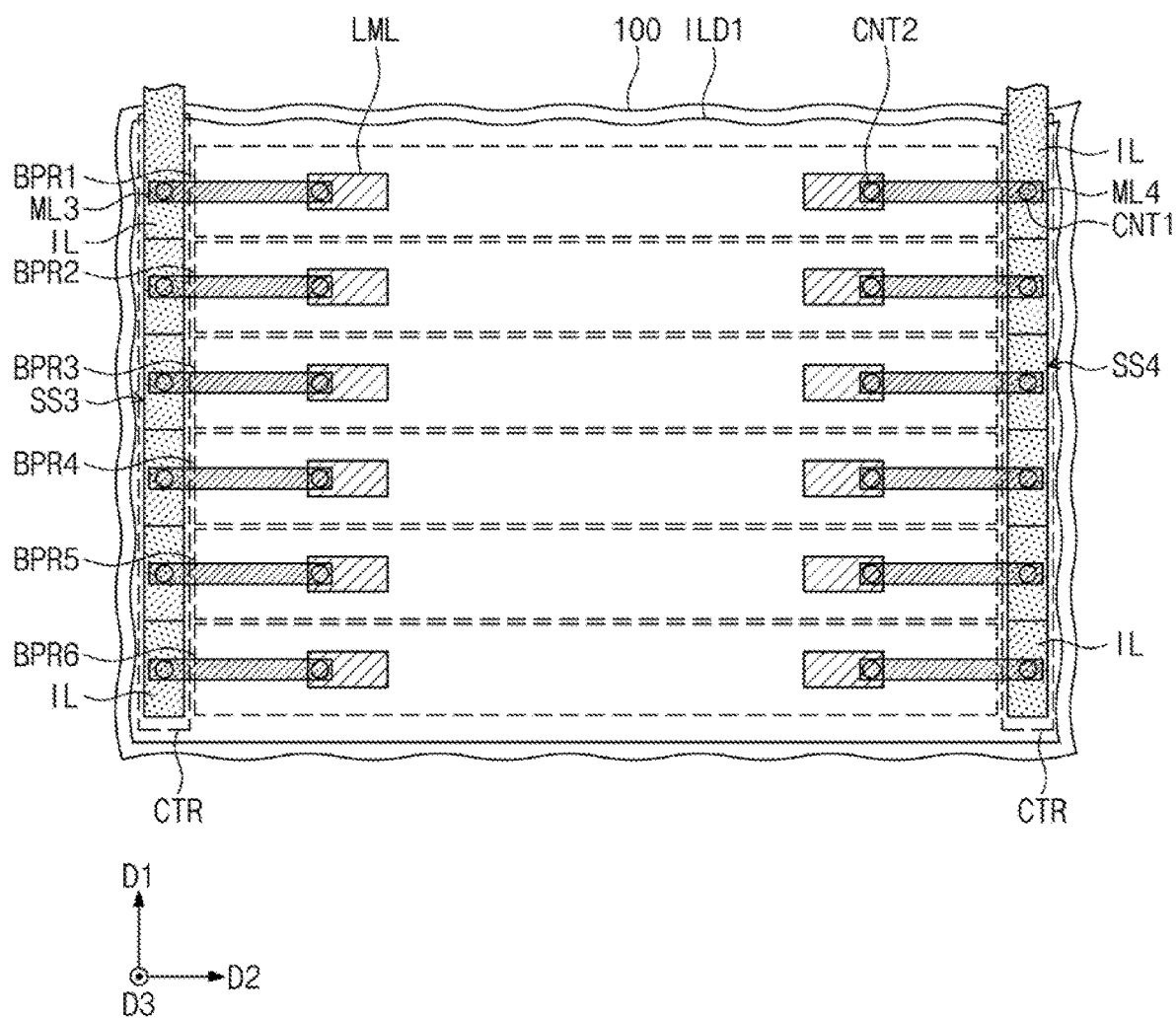
FIG. 8C illustrates a plan view showing a contact region and a bit peripheral circuit region of FIG. 7 according to some exemplary embodiments of the present inventive concepts.
Figure 9:
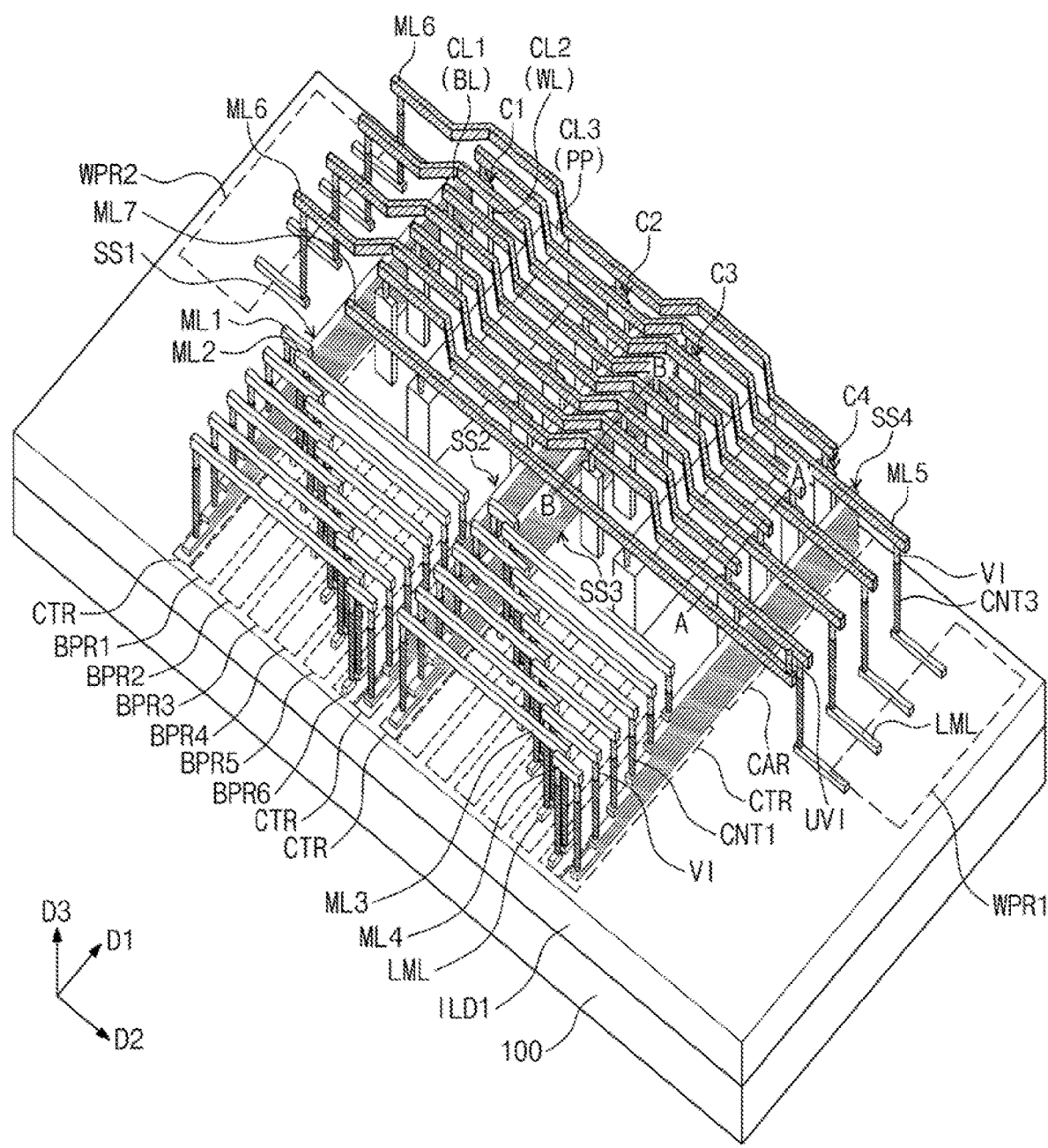
FIG. 9 illustrates a perspective view showing a three-dimensional semiconductor memory device according to some exemplary embodiments of the present inventive concepts.
Figure 10A:
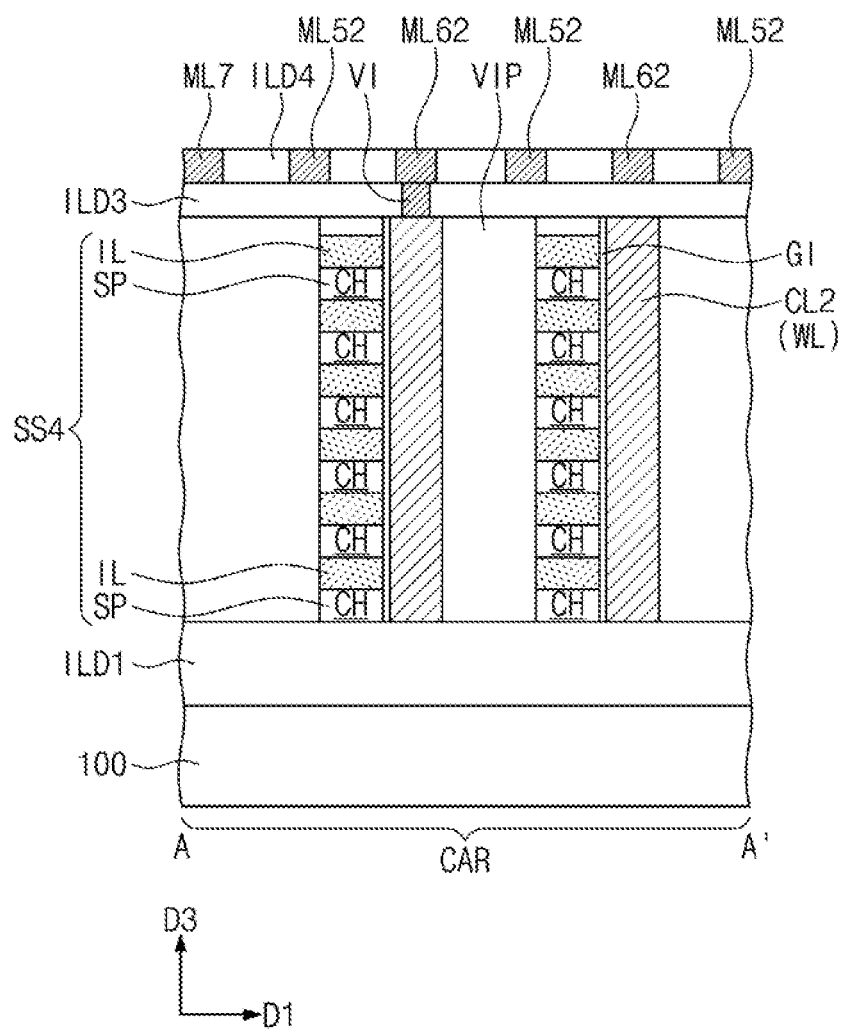
FIGS. 10A and 10B illustrate cross-sectional views respectively taken along lines A-A' and B-B' of FIG. 9 according to some exemplary embodiments of the present inventive concepts.
Figure 10B:
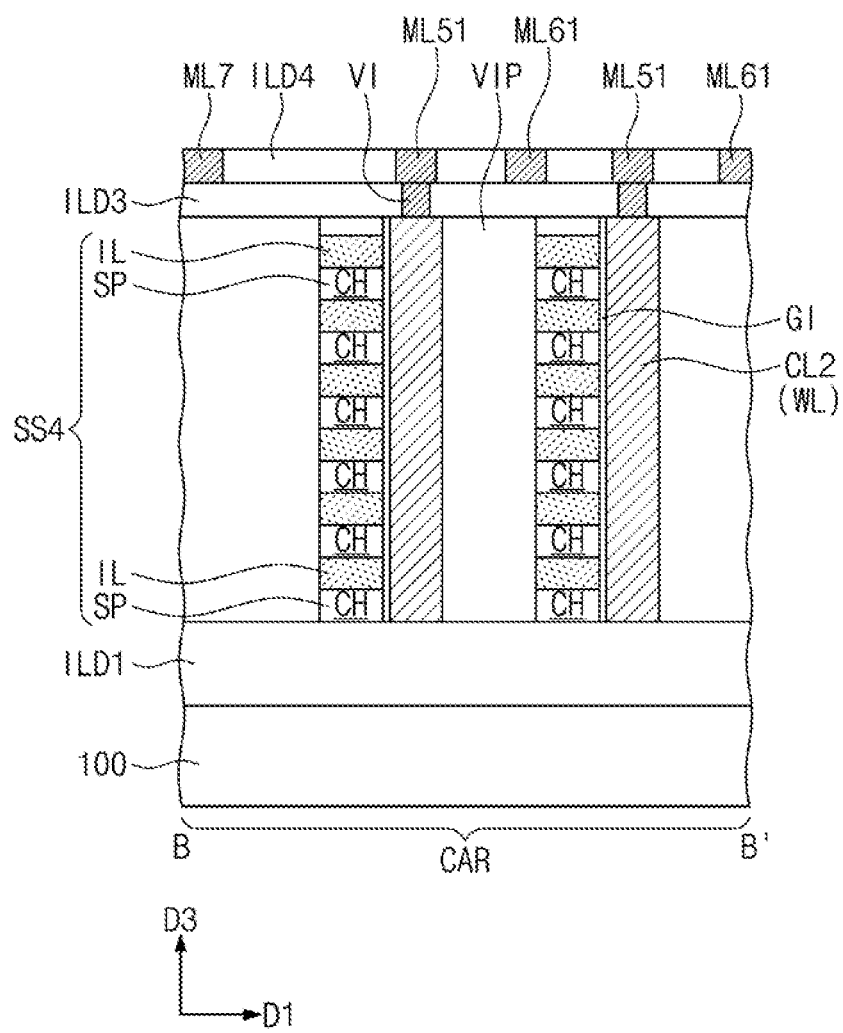
Figure 10C:
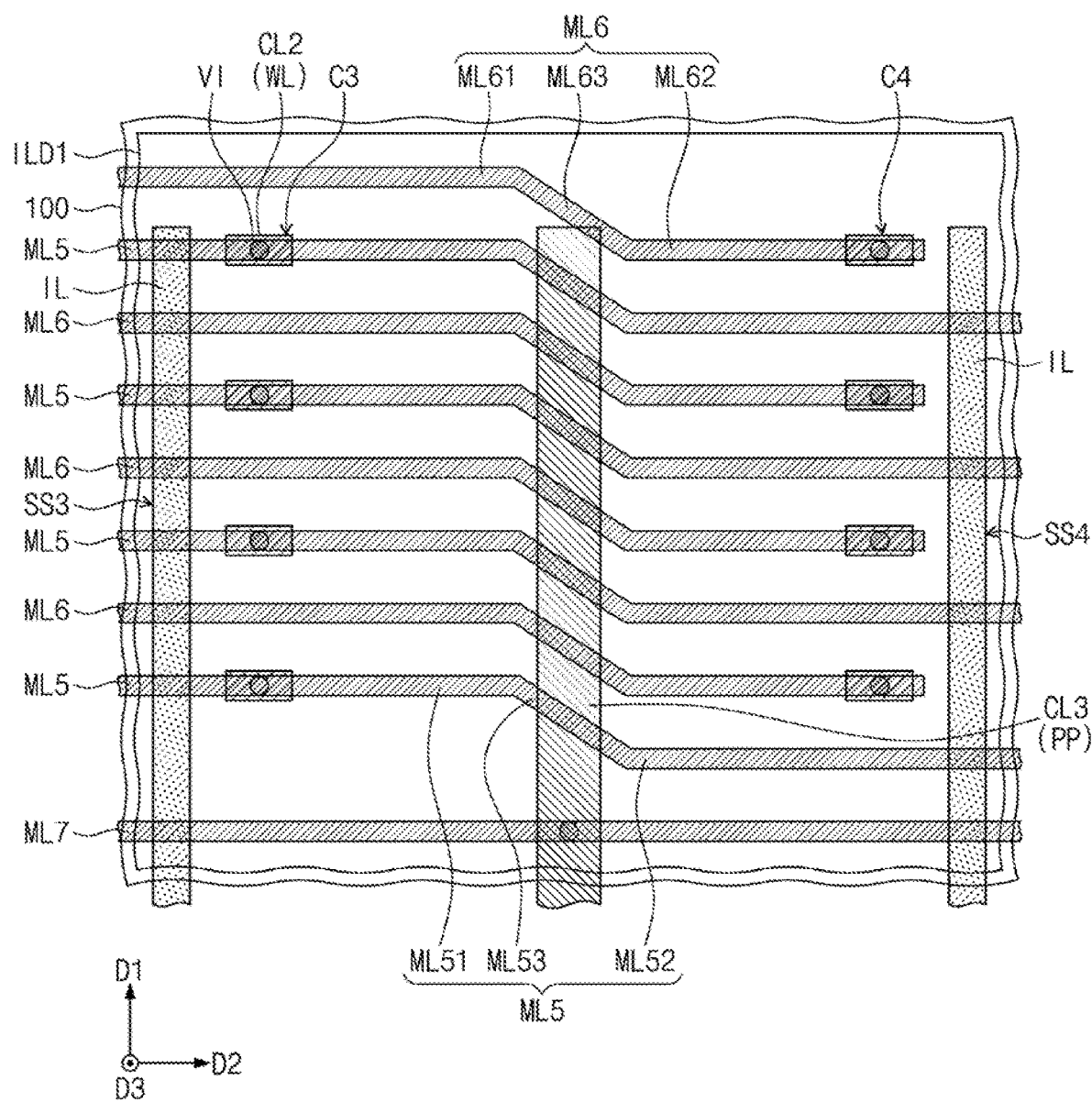
FIG. 10C illustrates a plan view showing a cell region of FIG. 9 according to some exemplary embodiments of the present inventive concepts.
Figure 11:
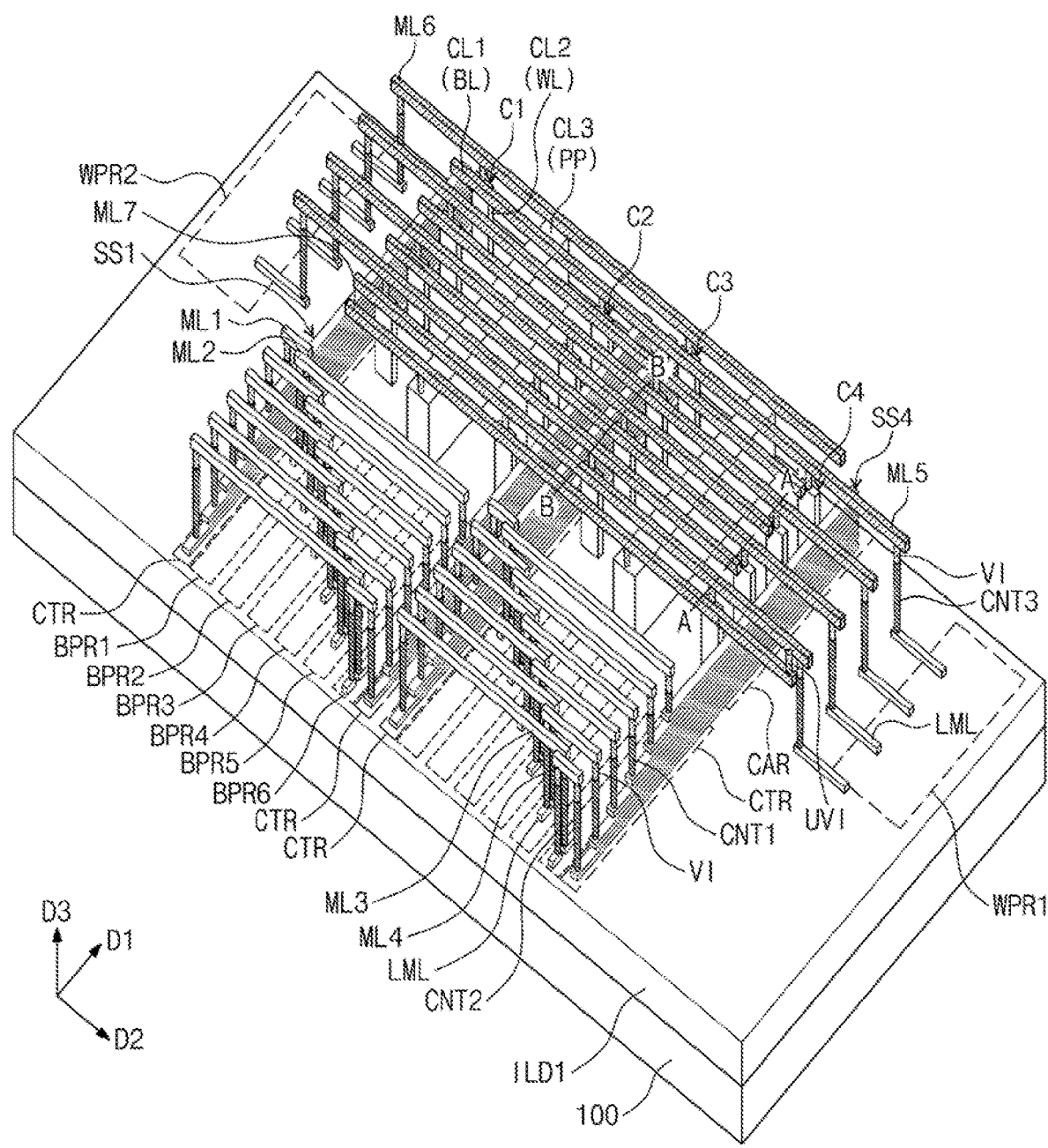
FIG. 11 illustrates a perspective view showing a three-dimensional semiconductor memory device according to some exemplary embodiments of the present inventive concepts.
Figure 12A:
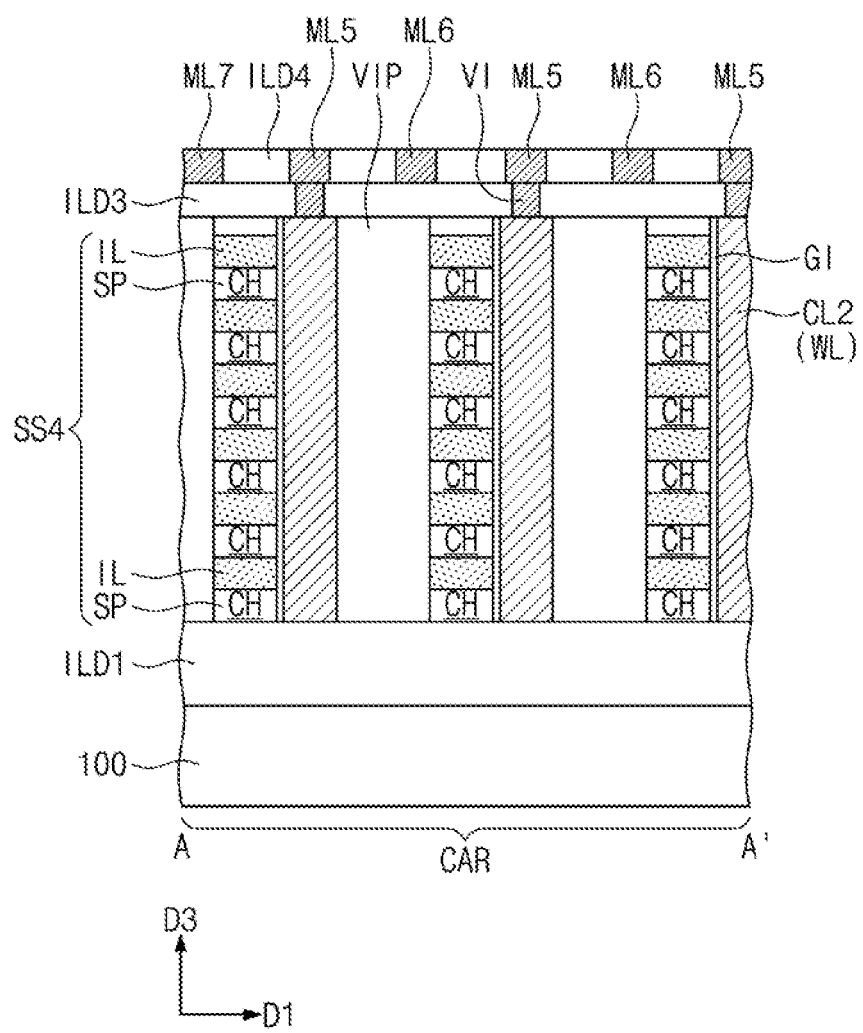
FIGS. 12A and 12B illustrate cross-sectional views respectively taken along lines A-A' and B-B' of FIG. 11 according to some exemplary embodiments of the present inventive concepts.
Figure 12B:
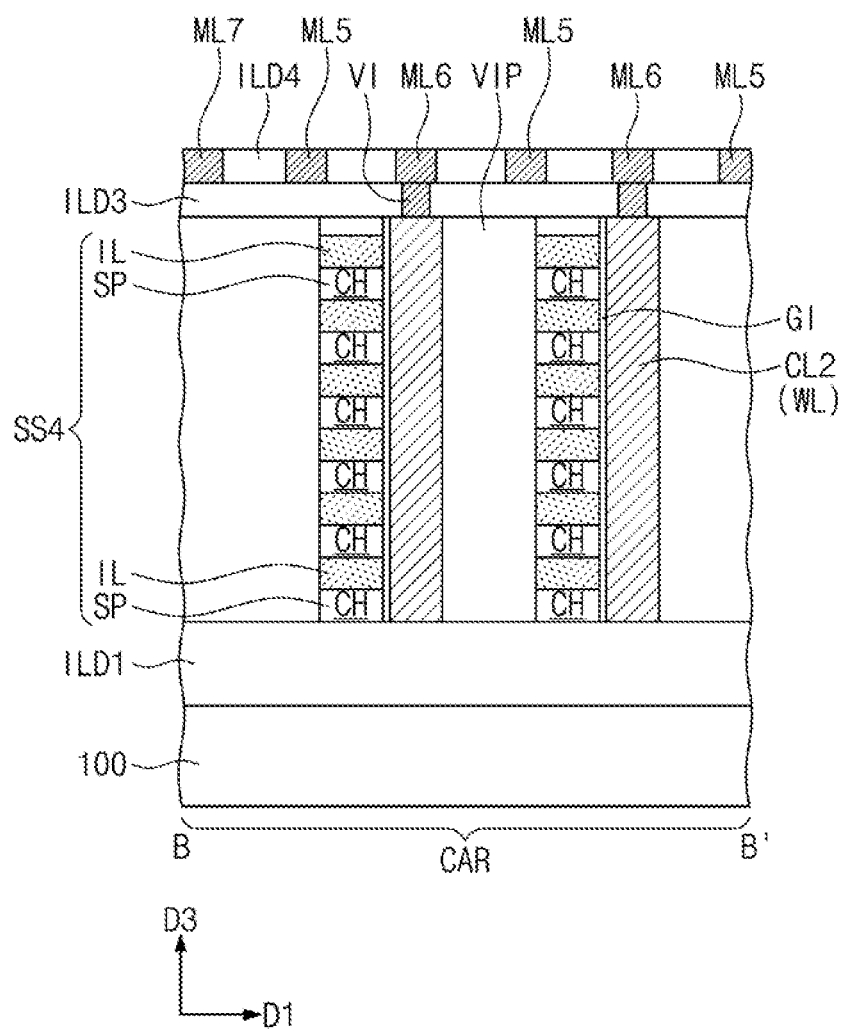
Figure 12C:
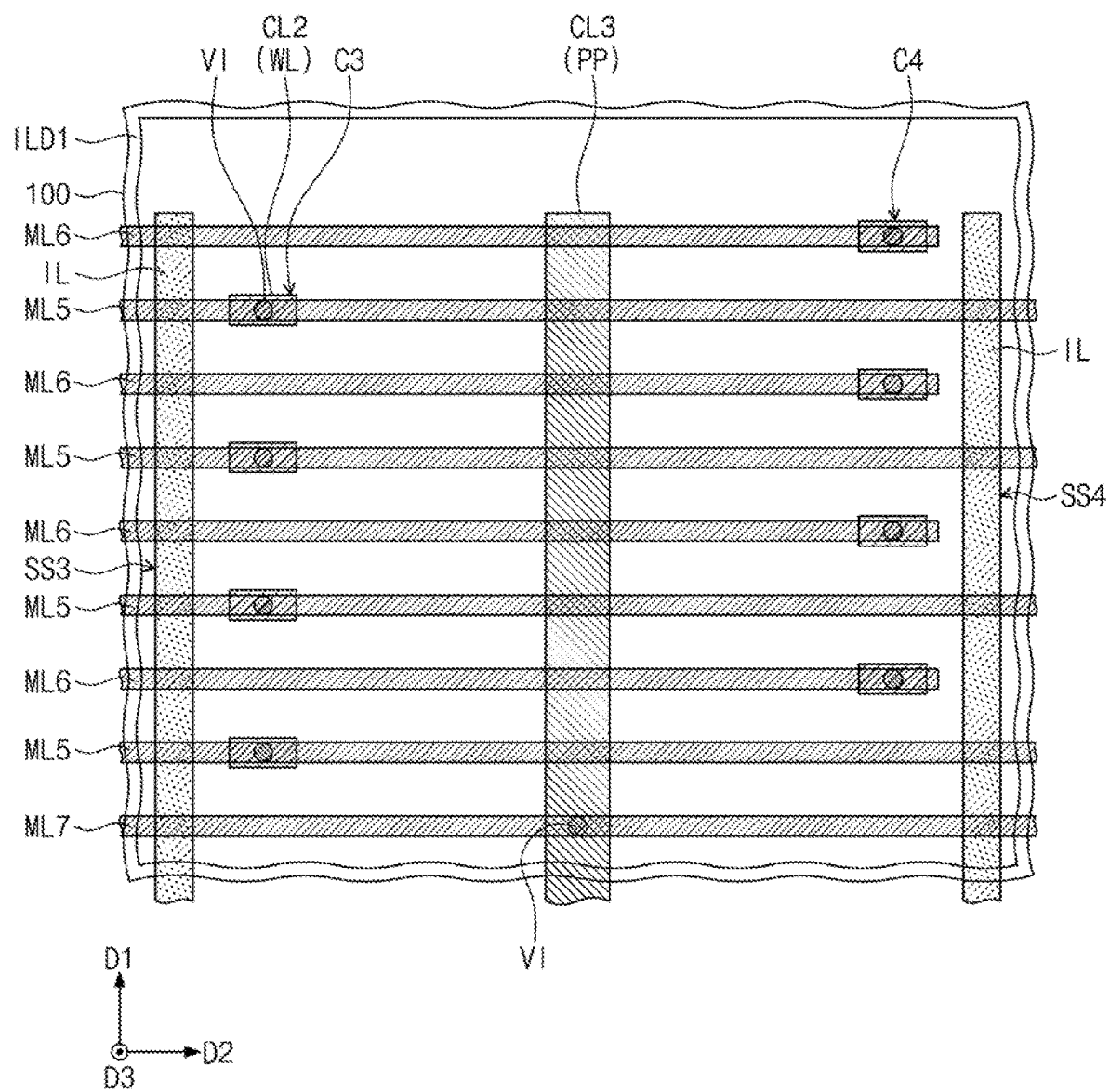
FIG. 12C illustrates a plan view showing a cell region of FIG. 11 according to some exemplary embodiments of the present inventive concepts.

Each of the first to fourth stack structures SS1 to SS4 may further include data vertically stacked storage elements DS. The dielectric layers IL may vertically separate the vertically stacked data storage elements DS from each other. As shown in FIG. 7A, the data storage elements DS may extend in the second direction D2 from corresponding semiconductor patterns SP.

The data storage elements DS may directly contact corresponding semiconductor patterns SP. For example, each of the data storage elements DS may be located at substantially the same level as the semiconductor patterns SP that it contacts. The data storage elements DS may be connected to the second impurity regions SD2 of the semiconductor patterns SP.

Figure 4:
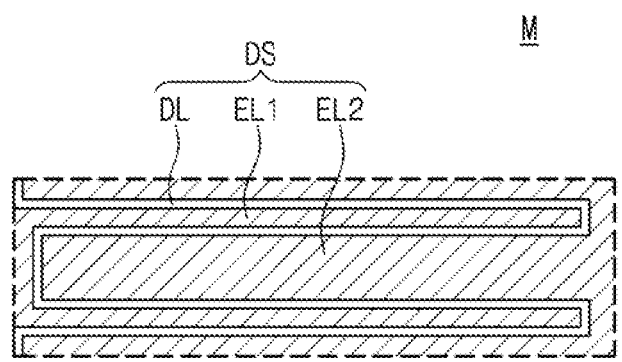
FIG. 4 illustrates an enlarged view showing section M of FIG. 3A according to some exemplary embodiments of the present inventive concepts.
Figure 5:
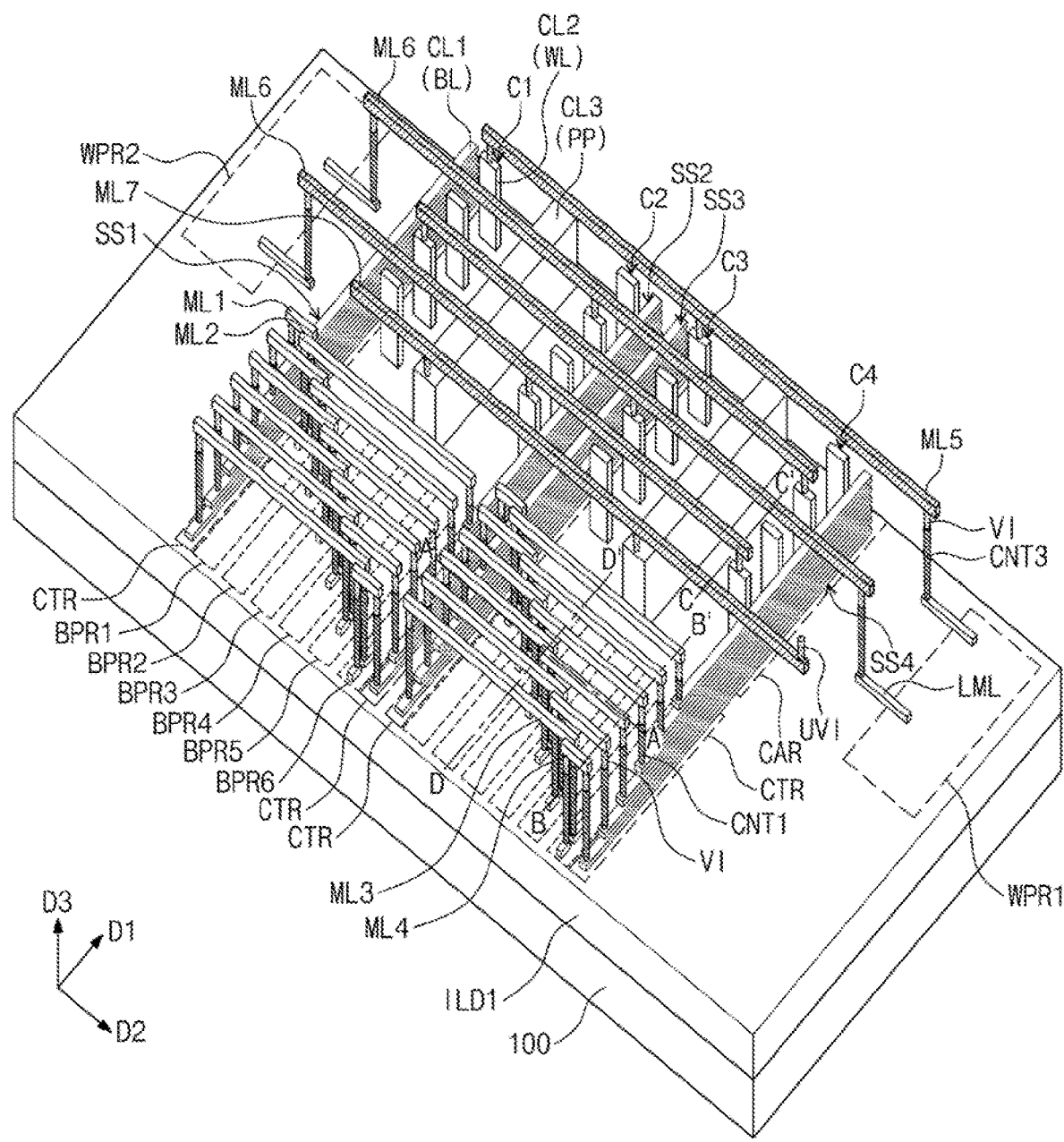
FIG. 5 illustrates a perspective view showing a three-dimensional semiconductor memory device according to some exemplary embodiments of the present inventive concepts.

Referring to FIG. 4, each of the data storage elements DS may include a first electrode EL1, a dielectric layer DL, and a second electrode EL2. For example, the data storage element DS may be a capacitor.

The first electrode EL1 may be directly connected to the second impurity region SD2 of the semiconductor pattern SP. In one exemplary embodiment, the first electrode EL1 may have a hollow cylindrical shape. The first electrode EL1 may include one or more of metal, metal nitride, and metal silicide. For example, the first electrode EL1 may include a refractory metal layer, such as a cobalt layer, a titanium layer, a nickel layer, a tungsten layer, and a molybdenum layer. The first electrode EL1 may include a metal nitride layer such as a titanium nitride layer, titanium silicon nitride layer, titanium aluminum nitride layer, tantalum nitride layer, tantalum silicon nitride layer, tantalum aluminum nitride layer, or a tungsten nitride layer.

The dielectric layer DL may be interposed between the first electrode EL1 and the second electrode EL2. In one exemplary embodiment, the dielectric layer DL may directly cover an inner sidewall of the first electrode EL1. For example, the dielectric layer DL may include one or more of metal oxide such as hafnium oxide, zirconium oxide, aluminum oxide, lanthanum oxide, tantalum oxide, and titanium oxide, and perovskite structured dielectric such as $SrTiO_3$(STO), $(Ba,Sr)TiO_3$(BST), $BaTiO_3$, PZT, and PLZT.

The second electrode EL2 may be provided on the dielectric layer DL. In one exemplary embodiment, the second electrode EL2 may fill an inside of the first electrode EL1 shaped like a cylinder. The second electrode EL2 may be connected to a third conductive line CL3 which will be discussed below. The second electrode EL2 may include one or more of impurity-doped silicon, metal, metal nitride, and metal silicide. For example, the second electrode EL2 may include a material substantially the same as that of the first electrode EL1.

The cell region CAR of the substrate 100 may be provided thereon with second conductive lines CL2. The second conductive lines CL2 may be configured to penetrate the first to fourth stack structures SS1 to SS4. In an exemplary embodiment, each of the second conductive lines CL2 may have a linear or bar shape that extends in the vertical direction (e.g., the third direction D3) to the top surface of the substrate 100. The second conductive lines CL2 of each of the first to fourth stack structures SS1 to SS4 may be arranged in the first direction D1. The second conductive lines CL2 may be disposed adjacent to corresponding semiconductor patterns SP on each of the first to fourth rows R1 to R4.

A first conductive line of the second conductive lines CL2 penetrating the third stack structure SS3 may be positioned close to sidewalls of the semiconductor patterns SP on the first row R1. The first conductive line of the second conductive lines CL2 may vertically extend on the sidewalk of the semiconductor patterns SP on the first row R1. A second conductive line of the second conductive lines CL2 penetrating the third stack structure SS3 may be positioned close to sidewalls of the semiconductor patterns SP on the second row R2. The second conductive line of the second conductive lines CL2 may vertically extend on the sidewalls of the semiconductor patterns SP on the second row R2. As shown in FIG. 3B, a vertical dielectric pattern VIP may be interposed between the first conductive line of the second conductive lines CL2 and the semiconductor patterns SP on the second row R2. The vertical dielectric pattern VIP may include a silicon oxide layer.

Each of the second conductive lines CL2 may be disposed on the channel regions CH of the semiconductor patterns SP adjacent to the each of the second conductive lines CL2. The second conductive lines CL2 may be gate electrodes. For example, the second conductive lines CL2 may be the gates of the memory cell transistors MCT discussed with reference to FIG. 1. A gate dielectric layer GI may be interposed between the second conductive line CL2 and the channel regions CH of the semiconductor patterns SP. In exemplary embodiments, the gate dielectric layer GI may include a high-k dielectric layer, a silicon oxide layer, a silicon nitride layer, a silicon oxynitride layer, or a combination thereof. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The second conductive lines CL2 may include a conductive material. The conductive material may be one of doped semiconductor, conductive metal nitride, metal, and a metal-semiconductor compound. The second conductive lines CL2 may correspond to the word lines WL discussed above with reference to FIG. 1.

The cell region CAR of the substrate 100 may include third conductive lines CL3 that extend in the first direction D1 parallel to the first to fourth stack structures SS1 to SS4. A first conductive line of the third conductive lines CL3 may be disposed between the first and second stack structures SS1 and SS2, and a second conductive line of the third conductive lines CL3 may be disposed between the third and fourth stack structures SS3 and SS4.

The third conductive line CL3 may be directly connected to the second electrode EL2 of the data storage element DS discussed above with reference to FIG. 4. The first conductive line of the third conductive lines CL3 may be connected in common to the second electrodes EL2 of capacitors of the first and second stack structures 551 and 552. The second conductive line of the third conductive lines CL3 may be connected in common to the second electrodes EL2 of capacitors of the third and fourth stack structures SS3 and SS4.

The third conductive lines CL3 may include a conductive material. In exemplary embodiments, the conductive material may be one of doped semiconductor, conductive metal nitride, metal, and a metal-semiconductor compound. The third conductive lines CL3 may correspond to the ground lines PP discussed with reference to FIG. 1.

As shown in FIG. 3C, the first interlayer dielectric layer ILD1 may be provided thereon with a second interlayer dielectric layer ILD2 that covers the first to fourth stack structures SS1 to SS4. In exemplary embodiments, each of the first and second interlayer dielectric layers ILD1 and ILD2 may include one or more of a silicon oxide layer, a silicon nitride layer, and a silicon oxynitride layer.

In an exemplary embodiment, the first and second stack structures SS1 and SS2 may have substantially the same structure as that of the third and fourth stack structures SS3 and SS4. The first and second stack structures SS1 and SS2 may be symmetrical to the third and fourth stack structures SS3 and SS4. The first and second stack structures SS1 and SS2 may be mirror-symmetrical to each other about the third conductive line CL3. The third and fourth stack structures SS3 and SS4 may be mirror-symmetrical to each other about the third conductive line CL3. The second and third stack structures SS2 and SS3 may be mirror-symmetrical to each other about the second interlayer dielectric layer ILD2 that fills a gap between the second and third stack structures SS2 and SS3.

Referring to FIGS. 5, 6A, 68, 6C, 6D, 6E, and 6F, substrate 100 may include a cell region CAR, contact regions CTR, bit peripheral circuit regions BPR1 to BPR6, and word peripheral circuit regions WPR1 and WPR2.

The bit peripheral circuit regions BPR1 to BPR6 and the word peripheral circuit regions WPR1 and WPR2 may include peripheral circuits electrically connected to memory cell arrays. The peripheral circuit may include transistors, resistors, and capacitors. The bit peripheral circuit regions BPR1 to BPR6 may include a sense amplifier connected to bit lines BL on the cell region CAR. The word peripheral circuit regions WPR1 and WPR2 may include sub-word line drivers and/or row decoders connected to word lines WL on the cell region CAR.

In one exemplary embodiment, the bit peripheral circuit regions BPR1 to BPR6 may be disposed between the contact regions CTR. In one exemplary embodiment, the bit peripheral circuit regions BPR1 to BPR6 may include first to sixth bit peripheral circuit regions BPR1 to BPR6. The first to sixth bit peripheral circuit regions BPR1 to BPR6 may be disposed between a first stack structure SS1 on the contact region CTR and a second stack structure SS2 on the contact region CTR. Other first to sixth bit peripheral circuit regions BPR1 to BPR6 may be disposed between a third stack structure SS3 on the contact region CTR and a fourth stack structure SS4 on the contact region CTR.

In one exemplary embodiment, each of the first to sixth bit peripheral circuit regions BPR1 to BPR6 may have a bar or linear shape extending in a first direction D1. The first to sixth bit peripheral circuit regions BPR1 to BPR6 may be sequentially arranged in the second direction D2. The word peripheral circuit regions WPR1 and WPR2 may include a first word peripheral circuit region WPR1 and a second word peripheral circuit region WPR2. In one exemplary embodiment, the first and second word peripheral circuit regions WPR1 and WPR2 may be disposed on opposite sides of the cell region CAR.

Figure 6A:
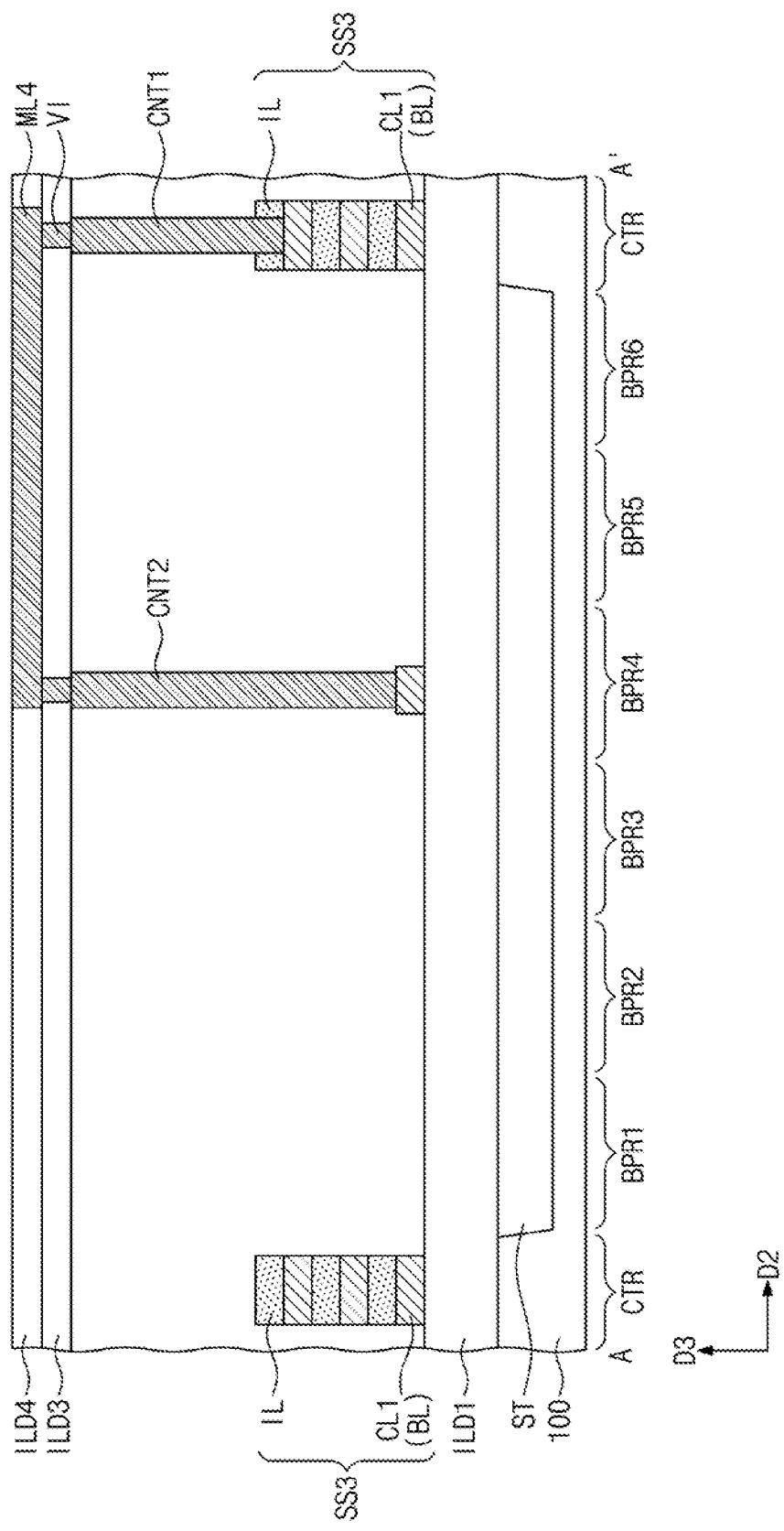
FIGS. 6A, 6B, 6C, and 6D illustrate cross-sectional views respectively taken along lines A-A', B-B', C-C', and D-D' of FIG. 5 according to some exemplary embodiments of the present inventive concepts.
Figure 6B:
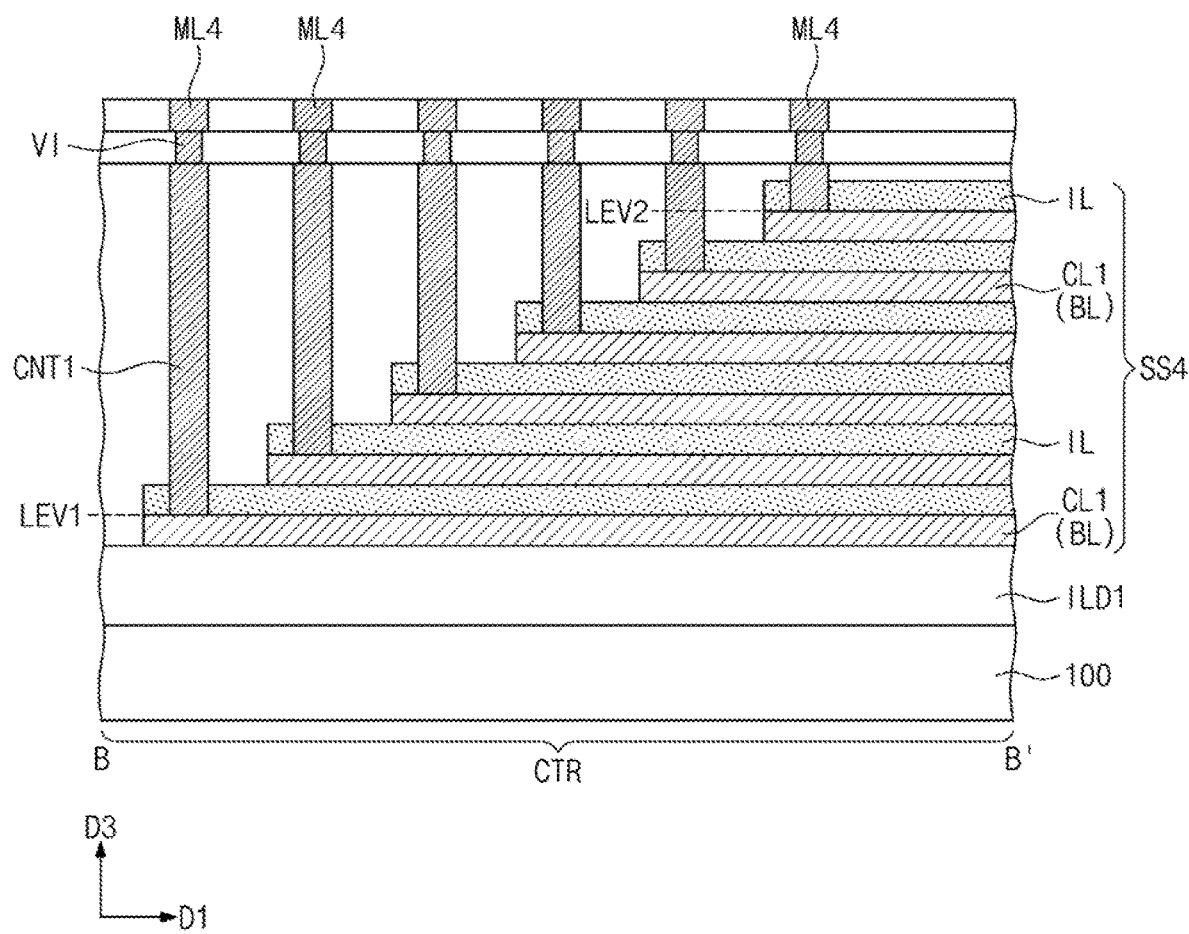
Figure 6C:
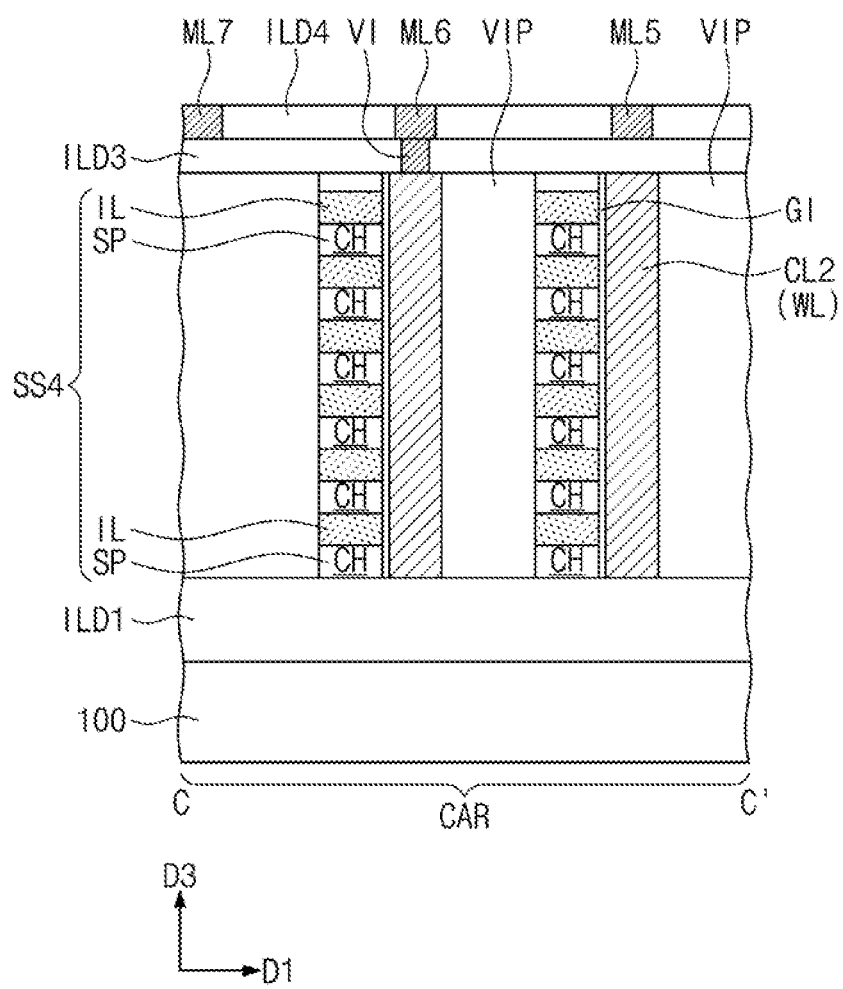
Figure 6D:
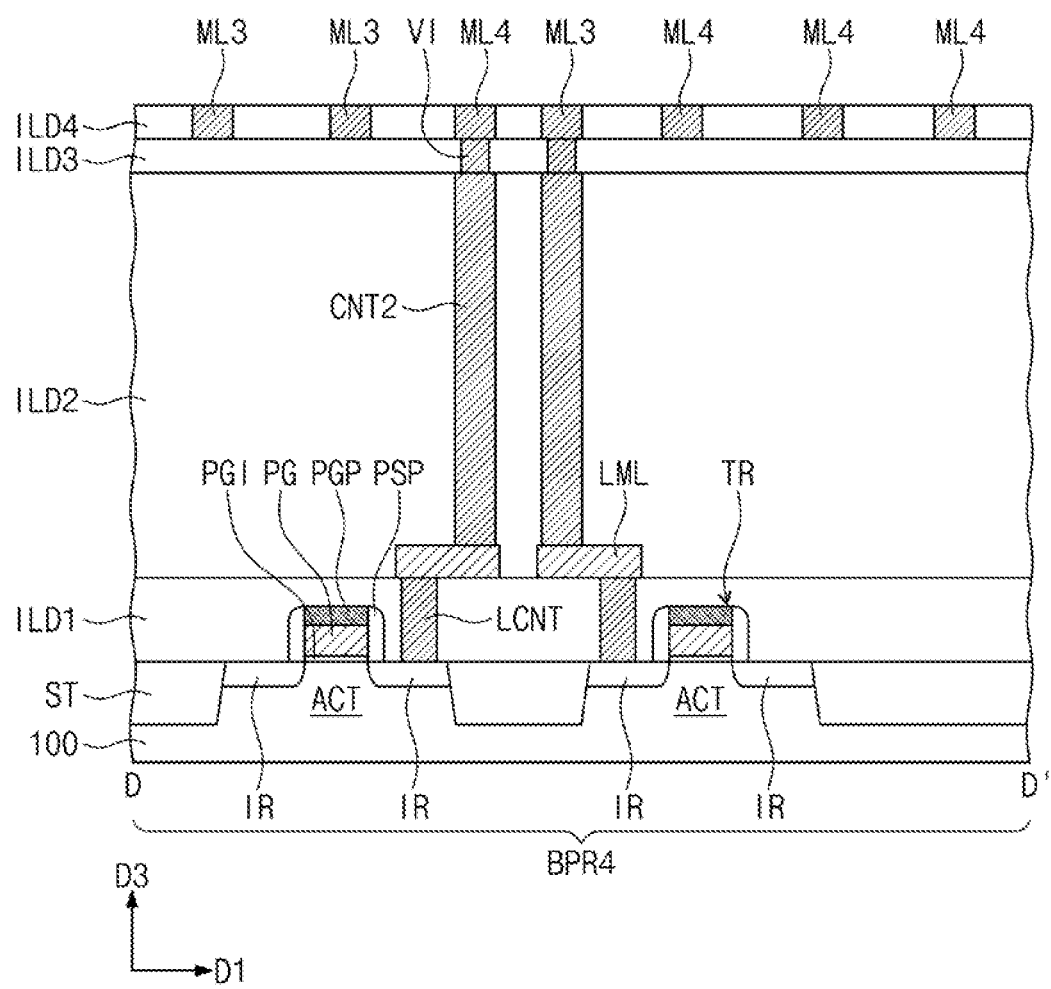

Referring to FIG. 6D, peripheral transistors TR may be provided on each of the first to sixth bit peripheral circuit regions BPR1 to BPR6. Each of the peripheral transistors TR may include an active region ACT, a peripheral gate electrode PG, a peripheral gate dielectric layer PGI, a gate capping layer PGP, and spacers PSP.

The first to sixth bit peripheral circuit regions BPR1 to BRPR6 of the substrate 100 may be provided thereon with a device isolation layer ST defining the active regions ACT. A plurality of active regions ACT may be defined on each of the first to sixth bit peripheral circuit regions BPR1 to BPR6. Each of the active regions ACT may include the peripheral gate electrode PG which runs across the active region ACT. Source/drain regions IR may be provided on an upper portion of the active region ACT on opposite sides of the peripheral gate electrode PG. The peripheral gate dielectric layer PGI may be interposed between the peripheral gate electrode PG and the active region ACT. The gate capping layer PGP may be provided on the peripheral gate electrode PG. A pair of spacers PSP may be provided on opposite sidewalls of the peripheral gate electrode PG. The peripheral transistors TR on each of the first to sixth bit peripheral circuit regions BPR1 to BPR6 may be spaced apart from each other in the first direction D1. A first interlayer dielectric layer ILD1 may cover the peripheral transistors TR.

A pair of lower connection lines LML may be included on each of the first to sixth bit peripheral circuit regions BPR1 to BPR6. In one exemplary embodiment, the pair of lower connection lines LML may be spaced apart from each other in the first direction D1. The pair of lower connection lines may include a first lower connection line LML and a second lower connection line LML. The first lower connection line LML may be disposed closer to the cell region CAR than the second lower connection line LML. Each of the lower connection lines LML may have a bar or linear shape extending in the first direction D1.

Other lower connection lines LML may be provided on the first and second word peripheral circuit regions WPR1 and WPR2. In an exemplary embodiment, each of the lower connection lines LML may have a bar or linear shape extending in the second direction D2. The lower connection lines LML may be arranged in the first direction D1.

As shown in FIG. 6D, each of the lower connection lines LML may be electrically connected to the source/drain region IR of the active region ACT through a lower contact LCNT penetrating the first interlayer dielectric layer ILD1.

Similar to the peripheral transistors TR on the first to sixth hit peripheral circuit regions BPR1 to BPR6 shown in FIG. 6D, peripheral transistors may be provided on the first and second word peripheral circuit regions WPR1 and WPR2.

The first to fourth stack structures SS1 to SS4 may be provided on the cell region CAR and the contact regions CTR of the substrate 100. The first to fourth stack structures SS1 to SS4 may be provided on the first interlayer dielectric layer ILD1. The first to fourth stack structures SS1 to SS4 may be located at a higher level than that of the peripheral transistors TR of the first to sixth bit peripheral circuit regions BPR1 to BPR6 and that of the peripheral transistors of the first and second word peripheral circuit regions WPR1 and WPR2.

A second interlayer dielectric layer ILD2 may be provided to cover the first to fourth stack structures SS1 to SS4, and first contacts CNT1 may be provided to penetrate the second interlayer dielectric layer ILD2 and to contact the first conductive lines CL1 on the contact regions CTR. Second contacts CNT2 may be provided to penetrate the second interlayer dielectric layer ILD2 and to contact the lower connection lines LML on the first to sixth bit peripheral circuit regions BPR1 to BPR6. Third contacts CNT3 may be provided to penetrate the second interlayer dielectric layer ILD2 and to contact the lower connection lines LML on the first and second word peripheral circuit regions WPR1 and WPR2.

The first contacts CNT1 in contact with the first conductive lines CL1 on the contact regions CTR may be arranged in the first direction D1. The first contacts CNT1 on the contact regions CTR may be disposed on a stepwise structure of each of the first to fourth stack structures SS1 to SS4. Therefore, the first contacts CNT1 on the contact regions CTR may have bottom surfaces having levels that increase the closer the first contact is to the cell region CAR. For example, the first contact CNT1 farthest away from the cell region CAR may have a bottom surface at a first level LEV1, and the first contact CNT1 closest to the cell region CAR may have a bottom surface at a second level LEV2. The second level LEV2 may be higher than the first level LEV1.

A pair of second contacts CNT2 may contact a pair of lower connection lines LML on each of the first to sixth bit peripheral circuit regions BPR1 to BPR6. The pair of second contacts CNT2 may be spaced apart from each other in the first direction D1. The pair of second contacts CNT2 may include a first contact and a second contact. As shown in FIG. 6D, the first contact of the pair of second contacts CNT2 may contact a first connection line of the pair of lower connection lines LML. The second contact of the pair of second contacts CNT2 may contact a second connection line of the pair of lower connection lines LML. The first contact of the pair of second contacts CNT2 may be disposed closer to the cell region CAR than the second contact of the pair of second contacts CNT2. The first connection line of the pair of lower connection lines LML may extend in a direction from the first contact of the pair of second contacts CNT2 away from the second contact of the pair of second contacts CNT2. The second connection line of the pair of lower connection lines LML may extend in a direction from the second contact of the pair of second contacts CNT2 away from the first contact of the pair of second contacts CNT2.

Figure 6E:
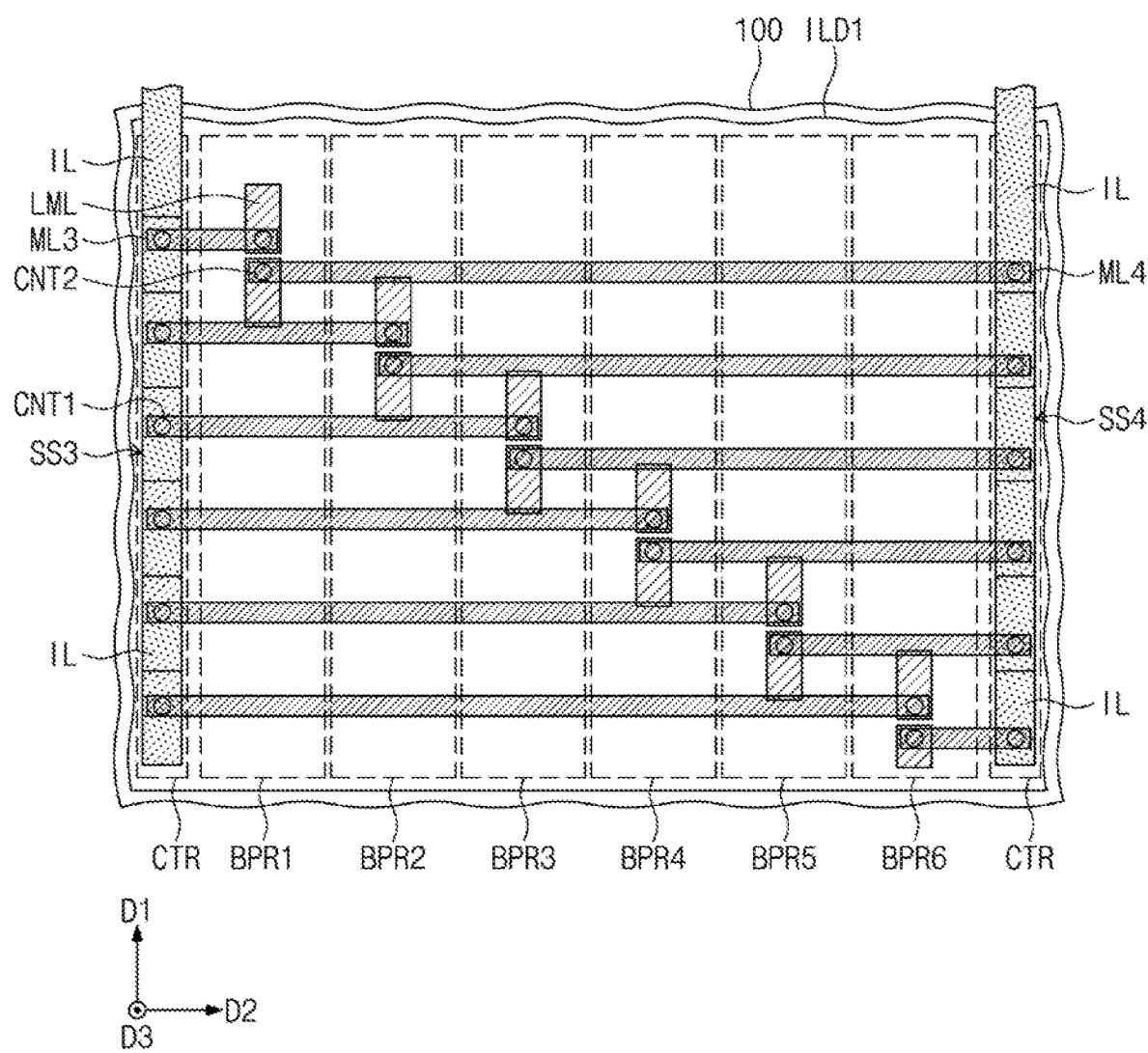
FIG. 6E illustrates a plan view showing a contact region and a bit peripheral circuit region of FIG. 5 according to some exemplary embodiments of the present inventive concepts.
Figure 6F:
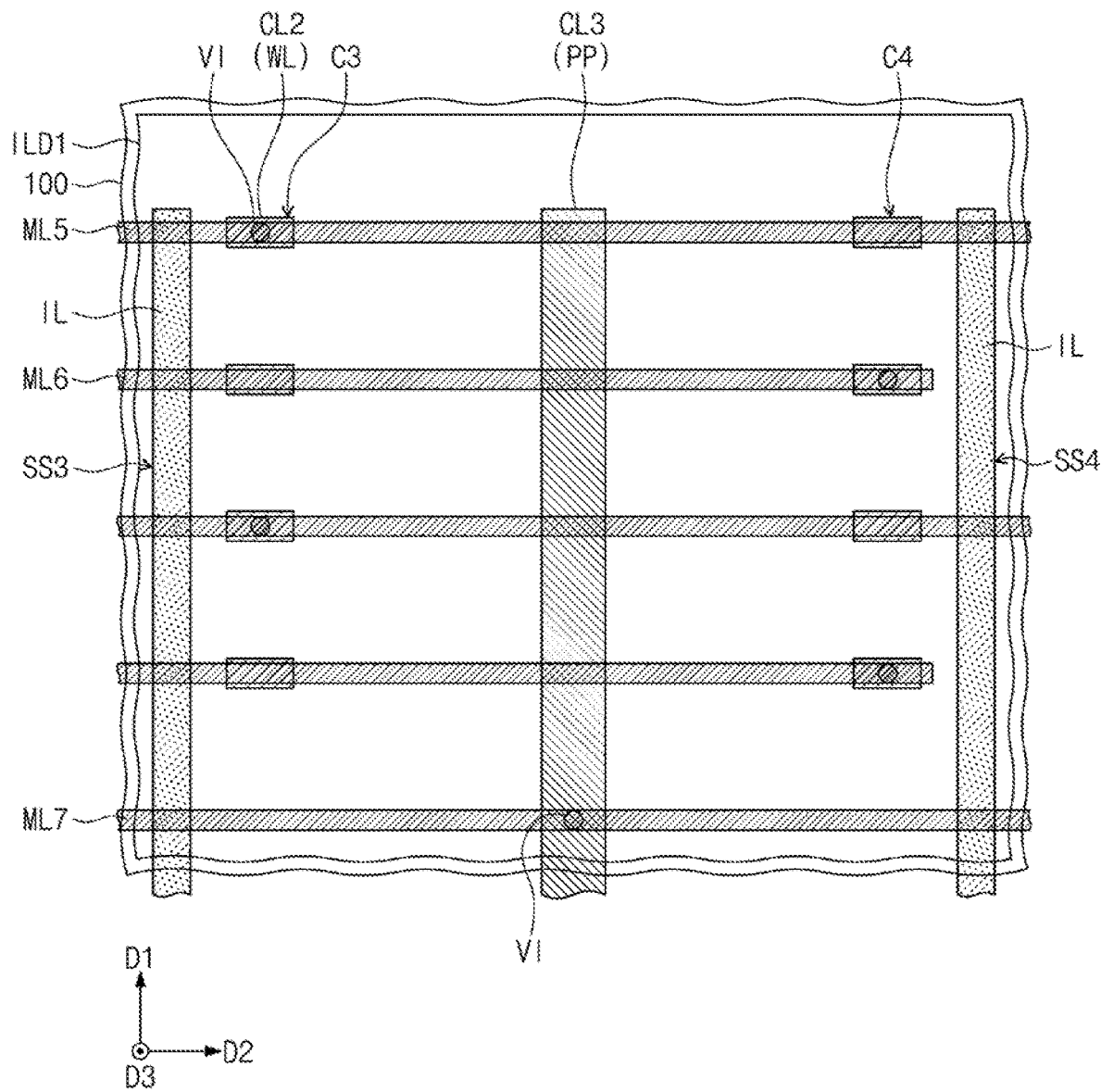
FIG. 6F illustrates a plan view showing a cell region of FIG. 5 according to some exemplary embodiments of the present inventive concepts.

As shown in FIG. 6E, a pair of second contacts CNT2 on the first hit peripheral circuit region BPR1 may be disposed closer to the cell region CAR than a pair of second contacts CNT2 on the second bit peripheral circuit region BPR2. The pair of second contacts CNT2 on the second bit peripheral circuit region BPR2 may be disposed closer to the cell region CAR than a pair of second contacts CNT2 on the third bit peripheral circuit region BPR3. The pair of second contacts CNT2 on the third bit peripheral circuit region BPR3 may be disposed closer to the cell region CAR than a pair of second contacts CNT2 on the fourth bit peripheral circuit region BPR4. The pair of second contacts CNT2 on the fourth hit peripheral circuit region BPR4 may be disposed closer to the cell region CAR than a pair of second contacts CNT2 on the fifth hit peripheral circuit region BPR5. A pair of second contacts CNT2 on the fifth bit peripheral circuit region BPR5 may be disposed closer to the cell region CAR than a pair of second contacts CNT2 on the sixth bit peripheral circuit region BPR6.

As shown in FIG. 6D, third and fourth interlayer dielectric layers ILD3 and ILD4 may be provided on the second interlayer dielectric layer ILD2. Vias VI may be provided in the third interlayer dielectric layer ILD3. In an exemplary embodiment, the first to seventh connection lines ML1 to ML7 may be provided in the fourth interlayer dielectric layer ILD4. Each of the first to seventh connection lines ML1 to ML7 may have a bar or linear shape extending in the second direction D2. The first to seventh connection lines ML1 to ML7 may contact the vias VI.

The first to fourth connection lines ML1 to ML4 may be electrically connected through the first contacts CNT1 and the vias VI to the first conductive lines CL1 of the first to fourth stack structures SS1 to SS4.

The first connection lines ML1 may be coupled to corresponding first conductive lines CL1 of the first stack structure SS1. The second connection lines ML2 may be coupled to corresponding first conductive lines CL1 of the second stack structure SS2. The third connection lines ML3 may be coupled to corresponding first conductive lines CL1 of the third stack structure SS3. The fourth connection lines ML4 may be coupled to corresponding first conductive lines CL1 of the fourth stack structure SS4.

The first to fourth connection lines ML1 to ML4 may be electrically connected through the second contacts CNT2 and the vias VI to the peripheral transistors TR of the first to sixth bit peripheral circuit regions BPR1 to BPR6.

The first connection lines ML1 may be coupled to the first to sixth hit peripheral circuit regions BPR1 to BPR6 between the first stack structure SS1 and the second stack structure SS2. The second connection lines ML2 may be coupled to the first to sixth bit peripheral circuit regions BPR1 to BPR6 between the first stack structure SS1 and the second stack structure SS2. The third connection lines ML3 may be coupled to the first to sixth bit peripheral circuit regions BPR1 to BPR6 between the third stack structure SS3 and the fourth stack structure SS4. The fourth connection lines ML4 may be coupled to the first to sixth bit peripheral circuit regions BPR1 to BPR6 between the third stack structure SS3 and the fourth stack structure SS4.

In exemplary embodiments, the number of the first connection lines ML1 may be the same as that of the first conductive lines CL1 of the first stack structure SS1. The number of the second connection lines ML2 may be the same as that of the first conductive lines CL1 of the second stack structure SS2. The number of the third connection lines ML3 may be the same as that of the first conductive lines CL1 of the third stack structure SS3. The number of the fourth connection lines ML4 may be the same as that of the first conductive lines CL1 of the fourth stack structure SS4.

In an exemplary embodiment, the third connection lines ML3 may include first to sixth connection lines of the third connection lines ML3. The first to sixth connection lines of the third connection lines ML3 may be correspondingly coupled to the first to sixth bit peripheral circuit regions BPR1 to BPR6. For example, the first connection line of the third connection lines ML3 may be coupled to the peripheral transistor TR of the first bit peripheral circuit region BPR1, and the sixth connection line of the third connection lines ML3 may be coupled to the peripheral transistor TR of the sixth bit peripheral circuit region BPR6.

The description of the third connection lines ML3 may be similarly applicable to the first, second, and fourth connection lines ML1, ML2, and ML4.

The lengths of the third connection lines ML3 may increase as the distance from the cell region CAR to the connection line increases. For example, the first connection line of the third connection lines ML3 may have a length that is less than that of each of remaining third connection lines ML3. The sixth connection line of the third connection lines ML3 may have a length greater than that of each of the remaining third connection lines ML3.

The lengths of the fourth connection lines ML4 may decrease as the distance from the cell region CAR to the connection line increases. For example, the length of the first connection line of the fourth connection lines ML4 may be greater than that of each of remaining fourth connection lines ML4. The sixth connection line of the fourth connection lines ML4 may have a length that is less than that of each of remaining fourth connection lines ML4.

The length of the first connection line of the third connection lines ML3 may be less than the length of the first connection line of the fourth connection lines ML4. The length of the second connection line of the third connection lines ML3 may be less than the length of the second connection line of the fourth connection lines ML4. The length of the third connection line of the third connection lines ML3 may be less than the length of the third connection line of the fourth connection lines ML4. The length of the fourth connection line of the third connection lines ML3 may be greater than the length of the fourth connection line of the fourth connection lines ML4. The length of the fifth connection line of the third connection lines ML3 may be greater than the length of the fifth connection line of the fourth connection lines ML4. The length of the sixth connection line of the third connection lines ML3 may be greater than the length of the sixth connection line of the fourth connection lines ML4.

The first to sixth connection line of the third connection lines ML3 may be disposed closer to the cell region CAR correspondingly than the first to sixth connection lines of the fourth connection lines ML4. For example, the first connection line of the third connection lines ML3 may be disposed closer to the cell region CAR than the first connection line of the fourth connection lines ML4, and the sixth connection line of the third connection lines ML3 may be disposed closer to the cell region CAR than the sixth connection line of the fourth connection lines ML4.

Connection parts that connect the second contacts CNT2 to the first to sixth connection lines of the third connection lines ML3 may overlap in the first direction D1 with connection parts that connect the second contacts CNT2 to the first to sixth connection lines of the fourth connection lines ML4. For example, a connection part that connects the second contact CNT2 to the first one of the third connection lines ML3 may overlap in the first direction D1 with a connection part that connects the second contact CNT2 to the first one of the fourth connection lines ML4.

The third connection lines ML3 and the fourth connection lines ML4 may be alternately arranged along the first direction D1 between the third stack structure SS3 and the fourth stack structure SS4.

The first connection lines ML1 and the second connection lines ML2 may be alternately arranged along the first direction D1 between the first stack structure SS1 and the second stack structure SS2.

The first connection lines ML1 may have a similar structure to that of the third connection lines ML3 discussed above, and the second connection lines ML2 may have a similar structure to that of the fourth connection lines ML4 discussed above.

On the cell region CAR, the fifth connection lines ML5 may be electrically connected through the vias VI to the second conductive lines CL2. The fifth connection lines ML5 may extend from the cell region CAR onto the first word peripheral circuit region WPR1. The fifth connection lines ML5 may be electrically connected through the third contacts CNT3 and the vias VI to the lower connection lines LML on the first word peripheral circuit region WPR1.

On the cell region CAR, the sixth connection lines ML6 may be electrically connected through the vias VI to the second conductive lines CL2. The sixth connection lines ML6 may extend from the cell region CAR onto the second word peripheral circuit region WPR2. The sixth connection lines ML6 may be electrically connected through the third contacts CNT3 and the vias VI to the lower connection lines LML on the second word peripheral circuit region WPR2.

The fifth connection lines ML5 and the sixth connection lines ML6 may be alternately disposed along the first direction D1.

A first column C1 may be formed by the second conductive lines CL2 arranged in the first direction D1 of the first stack structure SS1. A second column C2 may be formed by the second conductive lines CL2 arranged in the first direction D1 of the second stack structure SS2. A third column C3 may be formed by the second conductive lines CL2 arranged in the first direction D1 of the third stack structure SS3. A fourth column C4 may be formed by the second conductive lines CL2 arranged in the first direction D1 of the fourth stack structure SS4.

First conductive lines of the second conductive lines CL2 on the first to fourth columns C1 to C4 may be aligned in the second direction D2. Second conductive lines of the second conductive lines CL2 on the first to fourth columns C1 to C4 may be aligned in the second direction D2. Third conductive lines of the second conductive lines CL2 on the first to fourth columns C1 to C4 may be aligned in the second direction D2. Fourth conductive lines of the second conductive lines CL2 on the first to fourth columns C1 to C4 may be aligned in the second direction D2.

The first conductive lines of the second conductive lines CL2 on the second and fourth columns C2 and C4 may be electrically connected, through the vias VI, to the overlying sixth connection line ML6. The first conductive lines of the second conductive lines CL2 on the first and third columns C1 and C3 may be electrically separated from the overlying sixth connection line ML6. For example, no vias VI may be provided between the sixth connection line ML6 and the underlying first conductive lines of the second conductive lines CL2 on the first and third columns C1 and C3. The second conductive lines of the second conductive lines CL2 on the first and third columns C1 and C3 may be electrically connected, through the vias VI, to the overlying fifth connection line ML5. The second conductive lines of the second conductive lines CL2 on the second and fourth columns C2 and C4 may be electrically separated from the overlying fifth connection line ML5. For example, no vias VI may be provided between the fifth connection line ML5 and the underlying second conductive lines of the second conductive lines CL2 on the second and fourth columns C2 and C4.

The third and fourth conductive lines of the second conductive lines CL2 on each of the first to fourth columns C1 to C4 may have a similar structure as that of the first and second conductive lines of the second conductive lines CL2 on each of the first to fourth columns C1 to C4. The fifth and sixth connection lines ML5 and ML6 on the third and fourth conductive lines of the second conductive lines CL2 on each of the first to fourth columns C1 to C4 may have a similar structure as that of the fifth and sixth connection lines M5 and M6 on the first and second conductive lines of the second conductive lines CL2 on each of the first to fourth columns C1 to C4.

In some exemplary embodiments, the fifth connection lines ML5 may vertically overlap with the second and fourth conductive hues of the second conductive lines CL2 on each of the first to fourth columns C1 to C4. The sixth connection lines ML6 may vertically overlap with the first and third conductive lines of the second conductive lines CL2 on each of the first to fourth columns C1 to C4.

On the cell region CAR, the seventh connection line ML7 may be electrically connected through the vias VI to the third conductive lines CL3. The seventh connection line ML7 may be connected through an upper via UVI to an upper connection line (not shown).

The lower connection line LML, the lower contact LCNT, the first to third contacts CNT1 to CNT3, and the first to seventh connection lines ML1 to ML7 may include a material consisting of one or more of aluminum, copper, tungsten, molybdenum, and cobalt.

According to some exemplary embodiments of the present inventive concepts, a semiconductor memory device may increase in integration because the first to sixth bit peripheral circuit regions BPR1 to BPR6 are disposed between the contact regions CTR.

The following will describe other exemplary embodiments of the present inventive concepts. In the embodiments that follow, a detailed description of technical features repetitive to those discussed above with reference to FIGS. 1, 2, 3A to 3C, 4, 5, and 6A to 6F will be omitted, and the differences thereof will be discussed in detail.

Referring to FIGS. 7, 8A, 8B, and 8C, the first to sixth bit peripheral circuit regions BPR1 to BPR6 may be disposed between the first stack structure SS1 on the contact region CTR and the second stack structure SS2 on the contact region CTR. Another first to sixth bit peripheral circuit regions BPR1 to BPR6 may be disposed between the third stack structure SS3 on the contact region CTR and the fourth stack structure SS4 on the contact region CTR. In an exemplary embodiment, each of the first to sixth bit peripheral circuit regions BPR1 to BPR6 may have a bar or linear shape extending in the second direction D2. The first to sixth bit peripheral circuit regions BPR1 to BPR6 may be sequentially arranged in a direction opposite to the first direction D1.

The peripheral transistors TR of each of the first to sixth bit peripheral circuit regions BPR1 to BPR6 may be spaced apart from each other in the second direction D2.

A pair of lower connection lines LML may be provided on each of the first to sixth bit peripheral circuit regions BPR1 to BPR6. The pair of lower connection lines LML may be spaced apart from each other in the second direction D2. The pair of lower connection lines LML may include first and second lower connection lines LML. The first lower connection line LML may be disposed closer than the second lower connection line LML to the third stack structure SS3 on the contact region CTR (or to the first stack structure SS1 on the contact region CTR). In one exemplary embodiment, each of the lower connection lines LML may have a bar or linear shape extending in the second direction D2.

A pair of second contacts CNT2 may contact a pair of lower connection lines LML on each of the first to sixth bit peripheral circuit regions BPR1 to BPR6. The pair of second contacts CNT2 may be spaced apart from each other in the second direction D2. The pair of second contacts CNT2 may include first and second ones of the second contacts CNT2. The first contact of the pair of second contacts CNT2 may contact a first connection line of the pair of lower connection lines LML. The second contact of the pair of second contacts CNT2 may contact a second connection line of the pair of lower connection lines LML. The first contact of the pair of second contacts CNT2 may be disposed closer than the second one of the pair of second contacts CNT2 to the third stack structure SS3 on the contact region CTR (or to the first stack structure SS1 on the contact region CTR). The first connection line of the pair of lower connection lines LML may extend in a direction from the first contact of the pair of second contacts CNT2 toward the second contact of the pair of second contacts CNT2. The second connection line of the pair of lower connection lines LML may extend in a direction from the second contact of the pair of second contacts CNT2 toward the first one of the pair of second contacts CNT2.

The first to fourth connection lines ML1 to ML4 may be electrically connected through the second contacts CNT2 and the vias VI to the peripheral transistors TR of the first to sixth bit peripheral circuit regions BPR1 to BPR6.

In an exemplary embodiment, each of the first to fourth connection lines ML1 to ML4 may have a bar or linear shape that extends in the second direction D2. In an exemplary embodiment, the first to fourth connection lines ML1 to ML4 may have substantially the same length. A sum of the lengths of the third and fourth connection lines ML3 and ML4 may be less than a distance in the second direction D2 between the third stack structure SS3 on the contact region CTR and the fourth stack structure SS4 on the contact region CTR.

Referring to FIGS. 9, 10A, 10B, and 10C, each of the fifth connection lines ML5 may include first segments ML51 that extend in the second direction D2 above the first and third stack structures SS1 and SS3, second segments ML52 that extend in the second direction D2 above the second and fourth stack structures SS2 and SS4, and third segments ML53 that connect the first segments ML51 to the second segments ML52. The third segments ML53 of the fifth connection line ML5 may extend above the third conductive line CL3.

Each of the first segments ML51 of the fifth connection line ML5 may be disposed on the same line in the second direction D2. Each of the second segments ML52 of the fifth connection line ML5 may be disposed on the same line in the second direction D2. In one exemplary embodiment, the first segments ML51 of the fifth connection line ML5 may be offset in the first direction D1 from the second segments ML52 of the fifth connection line ML5.

Each of the sixth connection lines ML6 may include first segments ML61 that extend in the second direction D2 above the first and third stack structures SS1 and SS3, second segments ML62 that extend in the second direction D2 above the second and fourth stack structures SS2 and SS4, and third segments ML63 that connect the first segments ML61 to the second segments ML62. The third segments ML63 of the sixth connection line ML6 may extend above the third conductive line CL3.

Each of the first segments ML61 of the sixth connection line ML6 may be disposed on the same line in the second direction D2. Each of the second segments ML62 of the sixth connection line ML6 may be disposed on the same line in the second direction D2. In one exemplary embodiment, the first segments ML61 of the sixth connection line ML6 may be offset in the first direction D1 from the second segments ML62 of the sixth connection line ML6.

In an exemplary embodiment, the fifth connection lines ML5 may include first, second, third, and fourth connection lines of the fifth connection lines ML5. The first to fourth connection lines of the fifth connection lines are sequentially disposed along the first direction D1. The first connection line of the fifth connection lines ML5 may be disposed closer than any other fifth connection line ML5 to the seventh connection line ML7. The fourth connection line of the fifth connection lines ML5 may be disposed farther away from the seventh connection line ML7 than any other fifth connection line ML5.

In one exemplary embodiment, the sixth connection lines ML6 may include first, second, third, and fourth connection lines of the sixth connection lines ML6. The first to fourth connection lines of the sixth connection lines ML6 are sequentially disposed along the first direction D1. The first connection line of the sixth connection lines ML6 may be disposed closer to the seventh connection line ML7 than any other sixth connection line ML6. The fourth connection line of the sixth connection lines ML6 may be disposed farther away from the seventh connection line ML7 than any other sixth connection line ML6.

The fifth connection lines ML5 and the sixth connection lines ML6 may be alternately disposed along the first direction D1.

The first segments ML51 of the first connection lines of the fifth connection lines ML5 may be disposed above the first conductive lines of the second conductive lines CL2 on the first and third columns C1 and C3. The first segments ML51 of the first connection line of the fifth connection lines ML5 may be electrically connected through the vias VI to the first conductive lines of the second conductive lines CL2 on the first and third columns C1 and C3.

The second segments ML52 of the first connection line of the fifth connection lines ML5 may be disposed between the seventh connection line ML7 and the first conductive line of the second conductive lines CL2 on the second column C2 and between the seventh connection line ML7 and the first conductive line of the second conductive lines CL2 on the fourth column C4. The second segments ML52 of the first connection line of the fifth connection lines ML5 may be electrically separated from the first conductive lines of the second conductive lines CL2 on the second and fourth columns C2 and C4. The second segments ML52 of the first connection line of the fifth connection lines ML5 may not be connected to the vias VI.

The second segments ML62 of the first connection line of the sixth connection lines ML6 may be disposed above the first conductive lines of the second conductive lines CL2 on the second and fourth columns C2 and C4. The second segments ML62 of the first connection line of the sixth connection lines ML6 may be electrically connected through the vias VI to the first conductive lines of the second conductive lines CL2 on the second and fourth columns C2 and C4.

The first segments ML61 of the first connection line of the sixth connection lines ML6 may be disposed between the first and second conductive line of the second conductive lines CL2 on the first column C1 and between the first and second conductive lines of the second conductive lines CL2 on the third column C3. The first segments ML61 of the first connection line of the sixth connection lines ML6 may be electrically separated from the first and second conductive lines of the second conductive lines CL2 on the first column C1, and electrically separated from the first and second conductive lines of the second conductive lines CL2 on the third column C3. The first segments ML61 of the first connection lines of the sixth connection lines ML6 may not be connected to the vias VI.

The fifth connection lines ML5 may be electrically connected to the second conductive lines CL2 on the first and third columns C1 and C3, and electrically separated from the second conductive lines CL2 on the second and fourth columns C2 and C4. The sixth connection lines ML6 may be electrically connected to the second conductive lines CL2 on the second and fourth columns C2 and C4, and electrically separated from the second conductive lines CL2 on the first and third columns C1 and C3.

The fifth connection lines ML5 may vertically overlap with the second conductive lines CL2 on each of the first and third columns C1 and C3. The sixth connection lines ML6 may vertically overlap with the second conductive lines CL2 on each of the second and fourth columns C2 and C4.

According to some exemplary embodiments of the present inventive concepts, a semiconductor memory device may have increased integration because the fifth and sixth connection lines ML5 and ML6 include portions that are offset from each other.

Referring to FIGS. 11, 12A, 12B, and 12C, the first conductive line of the second conductive lines CL2 on the first column C1 and the first conductive line of the second conductive lines CL2 on the second column C2 may not be aligned in the second direction D2 with each other, and are offset in the first direction D1 from each other. The first conductive line of the second conductive lines CL2 on the third column C3 and the first conductive line of the second conductive lines CL2 on the fourth column C4 may not be aligned in the second direction D2 with each other, and may be offset in the first direction D1 from each other. The second, third, and fourth conductive lines of the second conductive lines CL2 on the first to fourth columns C1 to C4 may have an offset structure identical or similar to that of the first conductive lines of the second conductive lines CL2 on the first to fourth columns C1 to C4.

In an exemplary embodiment, the fifth connection lines ML5 may include first, second, third, and fourth connection lines of the fifth connection lines ML5. The first to fourth connection lines are sequentially disposed along the first direction D1. The first connection line of the fifth connection lines ML5 may be disposed closer to the seventh connection line ML7 than any other fifth connection line ML5. The fourth connection line of the fifth connection lines ML5 may be disposed farther away from the seventh connection line ML7 than any other fifth connection line ML5.

The sixth connection lines ML6 may include first, second, third, and fourth connection lines of the sixth connection lines ML6. The first to fourth connection lines are sequentially disposed along the first direction D1. The first connection line of the sixth connection lines ML6 may be disposed closer to the seventh connection line ML7 than any other sixth connection line ML6. The fourth connection line of the sixth connection lines ML6 may be disposed farther away from the seventh connection line ML7 than any other sixth connection line ML6.

The first connection line of the fifth connection lines ML5 may be disposed above the first conductive lines of the second conductive lines CL2 on the second and fourth columns C2 and C4. The first connection line of the fifth connection lines ML5 may be electrically connected through the vias VI to the first conductive lines of the second conductive lines CL2 on the second and fourth columns C2 and C4.

The first connection line of the sixth connection lines ML6 may be disposed above the first conductive lines of the second conductive lines CL2 on the first and third columns C1 and C3. The first connection line of the sixth connection lines ML6 may be electrically connected through the vias VI to the first conductive lines of the second conductive lines CL2 on the first and third columns C1 and C3.

Similar to the first connection line of the fifth connection lines ML5, the second to fourth connection lines of the fifth connection lines ML5 may be electrically connected correspondingly to the second to fourth conductive lines of the second conductive lines CL2 on each of the second and fourth columns C2 and C4.

Similar to the first connection line of the sixth connection lines ML6, the second to fourth connection lines of the sixth connection lines ML6 may be electrically connected correspondingly to the second to fourth conductive lines of the second conductive lines CL2 on each of the first and third columns C1 and C3.

The fifth connection lines ML5 may be electrically connected to the second conductive lines CL2 on the second and fourth columns C2 and C4, and electrically separated from the second conductive lines CL2 on the first and third columns C1 and C3. The sixth connection lines ML6 may be electrically connected to the second conductive lines CL2 on the first and third columns C1 and C3, and electrically separated from the second conductive lines CL2 on the second and fourth columns C2 and C4.

The fifth connection lines ML5 may vertically overlap with the second conductive lines CL2 on each of the first and third columns C1 and C3. The sixth connection lines ML6 may vertically overlap with the second conductive lines CL2 on each of the second and fourth columns C2 and C4.

According to some exemplary embodiments of the present inventive concepts, the second conductive lines CL2 may have an offset structure, and thus a semiconductor memory device may have increased integration.

According to some exemplary embodiments of the present inventive concepts, a three-dimensional semiconductor memory device may have an increased integration because the hit peripheral circuit regions are disposed between contact regions.

Furthermore, the integration of the three-dimensional semiconductor memory device may be improved due to the connection line structures connected to gate electrodes of a cell region.

Although some exemplary embodiments of the present inventive concepts have been discussed with reference to accompanying figures, it will be understood that various changes in form and details may be made therein without departing from the spirit and scope of the present inventive concepts. It therefore will be understood that the exemplary embodiments described above are, just illustrative but not limiting in any aspects.

What is claimed:

1. A semiconductor memory device, comprising:
    a substrate including a cell region, first and second contact regions, and a bit peripheral circuit region disposed between the first and second contact regions;
    a first stack structure disposed on the cell region and the first contact region;
    a second stack structure disposed on the cell region and the second contact region; and
    a peripheral transistor disposed on the bit peripheral circuit region, the peripheral transistor being electrically connected to the first and second stack structures,
    wherein each of the first and second stack structures comprises:
        a plurality of semiconductor patterns vertically stacked on the cell region; and
        a plurality of conductive lines that are connected to the semiconductor patterns and extend along a first direction from the cell region onto corresponding first and second contact regions, and
    wherein the conductive lines have stepwise structures on the first and second contact regions,
    wherein the bit peripheral circuit region is arranged between the first and second contact regions, in a second direction that intersects the first direction.

2. The semiconductor memory device of claim 1, wherein the bit peripheral circuit region comprises a first bit peripheral circuit region and a second bit peripheral circuit region,
    the conductive lines of the first stack structure comprise a first conductive line and a second conductive line, the second conductive line being positioned at a lower level than a level of the first conductive line,
    the conductive lines of the second stack structure comprising a third conductive line and a fourth conductive line, the fourth conductive line being located at a lower level than a level of the third conductive line,
    the peripheral transistor on the first bit peripheral circuit region is electrically connected to the first and third conductive lines, and
    the peripheral transistor on the second bit peripheral circuit region is electrically connected to the second and fourth conductive lines.

3. The semiconductor memory device of claim 2, further comprising a plurality of first connection lines and a plurality of second connection lines, the first and second connection lines extending in the second direction,
    wherein the first connection lines electrically connect the first conductive line to the peripheral transistor on the first bit peripheral circuit region, and electrically connect the second conductive line to the peripheral transistor on the second bit peripheral circuit region, and
    wherein the second connection lines electrically connect the third conductive line to the peripheral transistor on the first bit peripheral circuit region, and electrically connect the fourth conductive line to the peripheral transistor on the second bit peripheral circuit region.

4. The semiconductor memory device of claim 3, wherein the first and second connection lines have substantially the same length.

5. The semiconductor memory device of claim 2, wherein the first and second bit peripheral circuit regions extend in the first direction and are arranged in the second direction.

6. The semiconductor memory device of claim 5, further comprising a plurality of first connection lines and a plurality of second connection lines, the first and second connection lines extending in the second direction, wherein the first connection lines electrically connect the first conductive line to the peripheral transistor on the first bit peripheral circuit region, and electrically connect the second conductive line to the peripheral transistor on the second bit peripheral circuit region, and wherein the second connection lines electrically connect the third conductive line to the peripheral transistor on the first bit peripheral circuit region, and electrically connect the fourth conductive line to the peripheral transistor on the second hit peripheral circuit region.

7. The semiconductor memory device of claim 6, wherein a length of the first connection line connected to the second conductive line is greater than a length of the first connection line connected to the first conductive line, and a length of the second connection line connected to the third conductive line is greater than a length of the second connection line connected to the fourth conductive line.

8. The semiconductor memory device of claim 7, wherein the length of the second connection line connected to the third conductive line is greater than the length of the first connection line connected to the first conductive line, and the length of the first connection line connected to the second conductive line is greater than the length of the second connection line connected to the fourth conductive line.

9. The semiconductor memory device of claim 8, wherein the second connection line connected to the third conductive line overlaps in the first direction with the first connection line connected to the first conductive line, and the first connection line connected to the second conductive line overlaps in the first direction with the second connection line connected to the fourth conductive line.

10. The semiconductor device of claim 1, wherein the plurality of conductive lines extend continuously along the first direction from the cell region onto corresponding first and second contact regions.

11. A semiconductor memory device, comprising:
a substrate;
a first stack structure and a second stack structure disposed on the substrate; and
a connection line extending in a first direction on the first and second stack structures,
wherein each of the first and second stack structures comprises:
a plurality of semiconductor patterns vertically stacked on the substrate; and
a gate electrode vertically extending adjacent to the semiconductor patterns, and
wherein the connection line is electrically connected to one of the gate electrodes of the first and second stack structures, and electrically separated from one of the gate electrodes of the first and second stack structures.

12. The semiconductor memory device of claim 11,
wherein the semiconductor patterns of each of the first and second stack structures comprise:
a plurality of first-row semiconductor patterns vertically stacked on the substrate; and
a plurality of second-row semiconductor patterns vertically stacked on the substrate,
wherein the gate electrode of each of the first and second stack structures comprises:
a first gate electrode vertically extending adjacent to the first-row semiconductor patterns; and
a second gate electrode vertically extending adjacent to the second-row semiconductor patterns, and
wherein the connection line comprises:
a first connection line electrically connected to the first gate electrode of the first stack structure and electrically separated from the first gate electrode of the second stack structure; and
a second connection line electrically connected to the second gate electrode of the second stack structure and electrically separated from the second gate electrode of the first stack structure,
the first connection line vertically overlapping with the first gate electrode of the first stack structure and the first gate electrode of the second stack structure,
the second connection line vertically overlapping with the second gate electrode of the first stack structure and the second gate electrode of the second stack structure.

13. The semiconductor memory device of claim 11, wherein the gate electrode of the first stack structure and the gate electrode of the second stack structure are offset from each other in a second direction intersecting the first direction.

14. The semiconductor memory device of claim 11,
wherein the semiconductor patterns of each of the first and second stack structures comprise:
a plurality of first-row semiconductor patterns vertically stacked on the substrate; and
a plurality of second-row semiconductor patterns vertically stacked on the substrate,
wherein the gate electrode of each of the first and second stack structures comprises:
a first gate electrode vertically extending adjacent to the first-row semiconductor patterns; and
a second gate electrode vertically extending adjacent to the second-row semiconductor patterns, and
wherein the connection line comprises:
a first connection line vertically overlapping with the first gate electrode of the second stack structure and disposed between the first and second gate electrodes of the first stack structures; and
a second connection line vertically overlapping with the first gate electrode of the first stack structure and disposed between the first and second gate electrodes of the second stack structures.

15. The semiconductor memory device of claim 14, wherein
the first connection line is electrically connected to the first gate electrode of the second stack structure, and
the second connection line is electrically connected to the first gate electrode of the first stack structure.

16. The semiconductor device of claim 11, wherein:
the substrate has a cell region and first and second contact regions; and
each of the first and second stack structures extend from the cell region onto corresponding first and second contact regions in a second direction intersecting the first direction.

* * * * *